US011134594B2

(12) United States Patent
Yamanaka et al.

(10) Patent No.: US 11,134,594 B2
(45) Date of Patent: Sep. 28, 2021

(54) COMPONENT SUPPLY SYSTEM AND COMPONENT MOUNTING MACHINE

(71) Applicant: FUJI CORPORATION, Chiryu (JP)

(72) Inventors: Daisuke Yamanaka, Chiryu (JP); Hideya Kuroda, Toyota (JP)

(73) Assignee: FUJI CORPORATION, Chiryu (JP)

( * ) Notice: Subject to any disclaimer, the term of this patent is extended or adjusted under 35 U.S.C. 154(b) by 189 days.

(21) Appl. No.: 16/462,364

(22) PCT Filed: Nov. 29, 2016

(86) PCT No.: PCT/JP2016/085379
§ 371 (c)(1),
(2) Date: May 20, 2019

(87) PCT Pub. No.: WO2018/100627
PCT Pub. Date: Jun. 7, 2018

(65) Prior Publication Data
US 2019/0373780 A1    Dec. 5, 2019

(51) Int. Cl.
*H05K 13/00* (2006.01)
*H05K 13/04* (2006.01)
(52) U.S. Cl.
CPC ..... *H05K 13/0084* (2013.01); *H05K 13/0406* (2018.08); *H05K 13/0409* (2018.08); *H05K 13/0419* (2018.08)
(58) Field of Classification Search
CPC ........... H05K 13/0084; H05K 13/0406; H05K 13/0409; H05K 13/0419
See application file for complete search history.

(56) References Cited

U.S. PATENT DOCUMENTS 5,036,582 A * 8/1991 Usui .................. B23Q 7/14
                                                       29/740
5,400,497 A * 3/1995 Watanabe ............ H05K 13/087
                                                       29/705
(Continued)

FOREIGN PATENT DOCUMENTS

CN       104641736 A      5/2015
EP       3 001 787 A1     3/2016
(Continued)

OTHER PUBLICATIONS

International Search Report dated Mar. 7, 2017, in PCT/JP2016/085379 filed on Nov. 29, 2016.

*Primary Examiner* — Carl J Arbes
(74) *Attorney, Agent, or Firm* — Oblon, McClelland, Maier & Neustadt, L.L.P.

(57) ABSTRACT

A component supply system comprising: a supply device including a storage section configured to store a component and a storage body mounting section where a storage body including at least the storage section is detachably mounted and configured to supply a component from the storage section of the storage body mounted on the storage body mounting section in a supply position; a first loading stand on which the storage body can be placed; and a second loading stand disposed at a different location from a location where the first loading stand is disposed and on which the storage body can be placed, wherein the storage body is transferred between either of the first loading stand and the second loading stand and the storage body mounting section.

6 Claims, 17 Drawing Sheets

(56) References Cited

U.S. PATENT DOCUMENTS

| | | | | |
|---|---|---|---|---|
| 5,649,356 A * | 7/1997 | Gieskes | ............... | H05K 13/028 29/710 |
| 6,195,876 B1 * | 3/2001 | Koyama | ............. | H05K 13/028 29/740 |
| 2008/0217394 A1 * | 9/2008 | Okada | ................ | H05K 13/0417 235/375 |
| 2015/0223374 A1 * | 8/2015 | Nozawa | ................. | H05K 3/301 29/739 |
| 2015/0237772 A1 | 8/2015 | Nozawa | | |
| 2015/0282399 A1 | 10/2015 | Nozawa | | |

FOREIGN PATENT DOCUMENTS

| | | | | |
|---|---|---|---|---|
| JP | 57-148393 | A | * | 9/1982 |
| JP | 62-149499 | A | * | 6/1987 |
| JP | 2172633 | A | * | 7/1990 |
| JP | 2254799 | A | * | 10/1990 |
| JP | 03003397 | A | * | 1/1991 |
| JP | 2632026 | B2 | * | 7/1997 |
| JP | 2015-109352 | A | | 6/2011 |
| JP | 2013-80855 | A | | 5/2013 |
| JP | 2016-192583 | A | | 11/2016 |
| WO | WO 2014/045378 | A1 | | 3/2014 |

* cited by examiner

COMPONENT SUPPLY SYSTEM AND COMPONENT MOUNTING MACHINE

TECHNICAL FIELD

The present application relates to a component supply system including a supply device on which a storage body for storing components is detachably mounted and a component mounting machine including the component supply system.

BACKGROUND ART

Some component supply systems include a supply device on which a storage body for storing components is detachably mounted. The following patent literatures describe an example of such a supply device.

PATENT LITERATURES

Patent Literature 1: JP-A-2013-080855
Patent Literature 2: WO 2014/045378

BRIEF SUMMARY

Technical Problem

In such a supply device on which a storage body for storing components is detachably mounted, it is necessary to exchange storage bodies in association with supply of components stored in one storage body. Due to this, it is desired to exchange storage bodies advantageously. The present disclosure has been made in view of such situations, and an object thereof is to preferably exchange storage bodies.

Solution to Problem

To solve the problem described above, according to the present disclosure, there is provided a component supply system including: a supply device including a storage section configured to store a component and a storage body mounting section where a storage body including at least the storage section is detachably mounted and configured to supply a component from the storage section of the storage body mounted on the storage body mounting section in a supply position; a first loading stand on which the storage body can be placed; and a second loading stand disposed at a different location from a location where the first loading stand is disposed and on which the storage body can be placed, wherein the storage body is transferred between either of the first loading stand and the second loading stand and the storage body mounting section.

Advantageous Effects

According to the present disclosure, storage bodies can be exchanged advantageously by transferring the storage bodies on either of the two loading stands: the first loading stand and the second loading stand.

DESCRIPTION OF EMBODIMENTS

Hereinafter, embodiments of the present disclosure will be described in detail with reference to drawings as modes for carrying out the present disclosure.

First Embodiment

<Configuration of Electronic Component Mounting Device>

Figure 1:
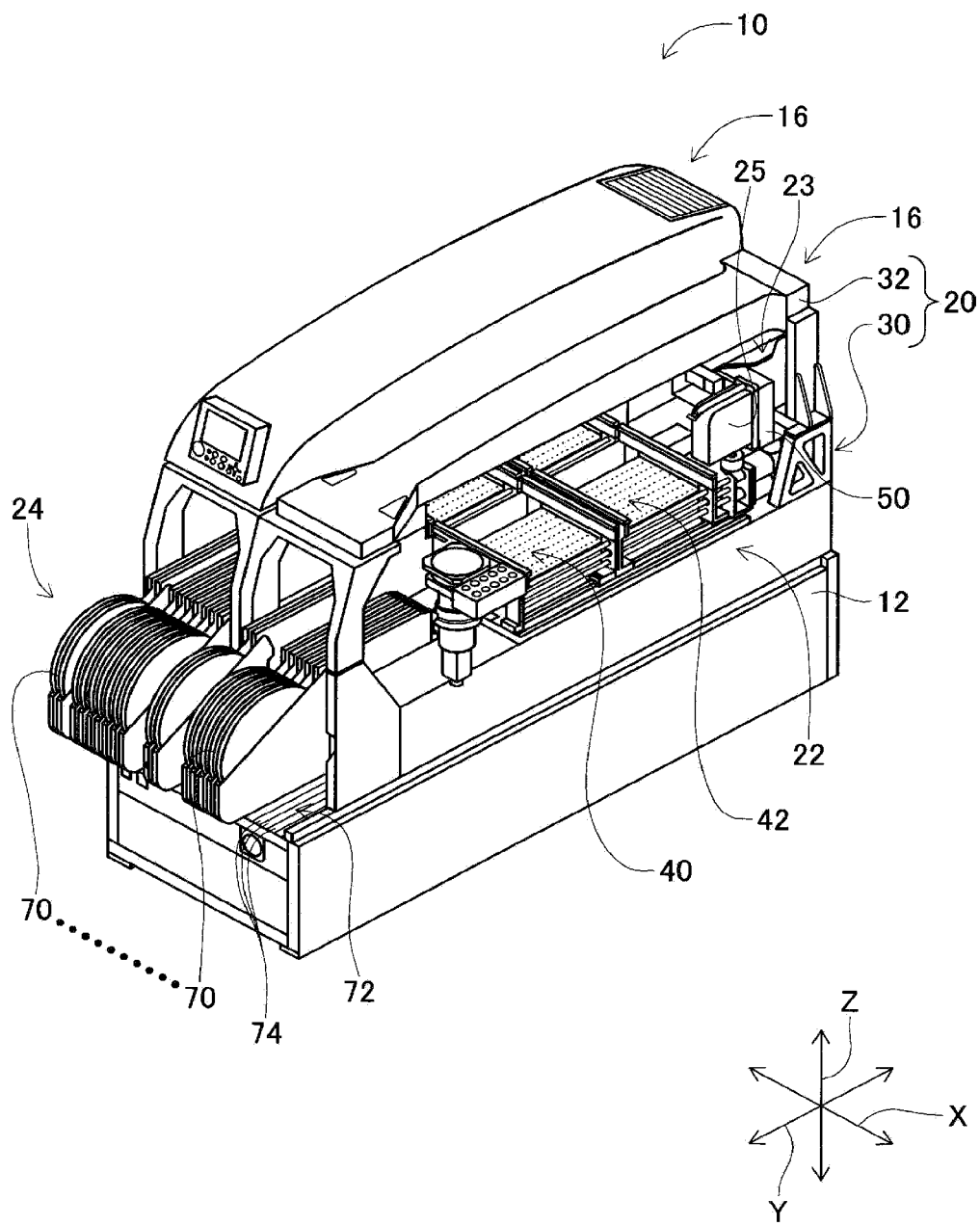
FIG. 1 is a perspective view showing an electronic component mounting device.

FIG. 1 shows electronic component mounting device 10. Electronic component mounting device 10 includes one system base 12 and two mounting machines 16 arranged side by side on system base 12. In the following description, a direction in which mounting machines 16 are arranged side by side is referred to as an X-axis direction, a horizontal direction perpendicular to the X-axis direction is referred to as a Y-axis direction, and a direction perpendicular to the X-axis direction and the Y-axis direction, that is, an up-down direction is referred to as a Z-axis direction.

Each mounting machine 16 mainly includes mounting machine main body 20, conveyance device 22, mounting head moving device (hereinafter sometimes abbreviated as a "moving device") 23, first supply device 24, mounting head 25, second supply device (see FIG. 2) 27, case exchange unit (refer to FIG. 10) 28, and control device (refer to FIG. 14) 29. Mounting machine main body 20 includes frame section 30 and beam section 32 extended over frame portion 30.

Conveyance device 22 includes two conveyor devices 40 and 42. Two conveyor devices 40 and 42 are provided on frame section 30 in such a manner as not only to be parallel to each other but also to extend in the X-axis direction. Two conveyor devices 40 and 42 convey corresponding circuit boards supported on conveyor devices 40 and 42 in the X-axis direction by electromagnetic motor (refer to FIG. 14) 46. In addition, the circuit boards are fixedly held by board holding devices (refer to FIG. 14) 48 in a predetermined position.

Moving device 23 is an XY-robot type moving device. Moving device 23 includes electromagnetic motor (refer to FIG. 14) 52 configured to cause slider 50 to slide in the X-axis direction and electromagnetic motor (refer to FIG. 14) 54 configured to cause slider 50 to slide in the Y-axis direction. Mounting head 25 is attached to slider 50, and mounting head 25 moves to any position on frame section 30 by the action of two electromagnetic motors 52 and 54.

First supply device 24 constitutes a feeder type supply device and includes tape feeders 70. Loading base 72 is provided on frame section 30, and multiple rails 74 extending in the Y-axis direction are formed on loading base 72. Then, tape feeders 70 are detachably mounted on any of multiple rails 74. Tape feeders 70 accommodate a taped component that is wound therearound. The taped component has electronic components arranged on a tape. Then, tape feeder 70 feeds out the taped component using feed device (refer to FIG. 14) 76. As a result, tape feeder 70 supplies an electronic component in a supply position by feeding out the taped component.

Figure 2:
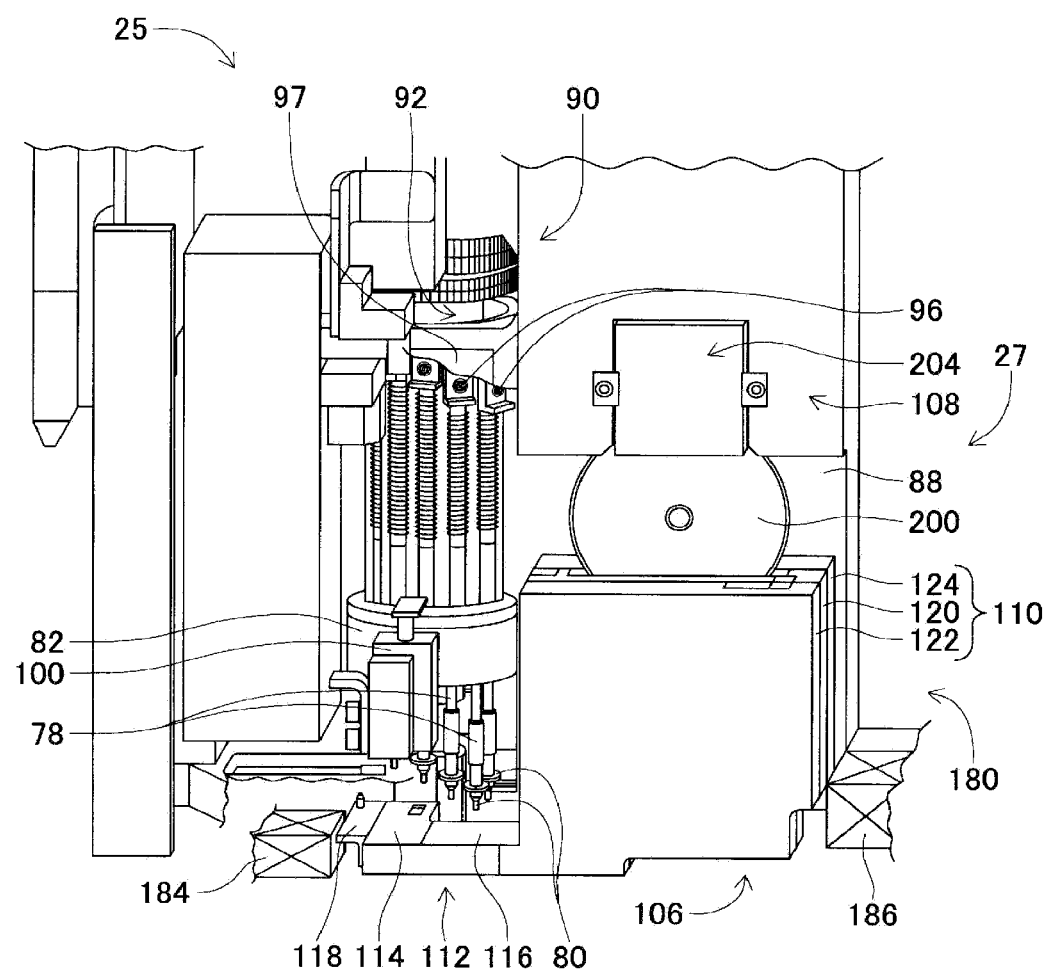
FIG. 2 is a perspective view showing a mounting head and a second supply device.

Mounting head 25 mounts an electronic component on a circuit board held by conveyance device 22. As shown in FIG. 2, mounting head 25 includes multiple mounting units 78, and a suction nozzle 80 is detachably mounted at each of tip portions of multiple mounting units 78. Multiple mounting units 78 are held on an outer circumferential portion of unit holding body 82 at equal angular intervals in such a manner as to extend perpendicularly in an axial direction, and suction nozzles 80 mounted at the tip portions of mounting units 78 extend downwards from a lower face of the unit holding body 82. Each suction nozzle 80 is connected to a positive and negative pressure supply device 86 (refer to FIG. 14), whereby suction nozzle 80 picks up and holds an electronic component through a negative pressure, and then releases the electronic component through a positive pressure.

Unit holding body 82 is rotatably held by head main body 88 of mounting head 25 and can be rotated to any angle by holding body rotating device 90. As a result, multiple mounting units 78 can be rotated to any angle about a rotation axis of unit holding body 82.

Each mounting unit 78 is held by unit holding body 82 so as to rotate about its own axis, and mounting head 25 includes unit rotating device 92 configured to cause each mounting unit 78 to rotate about its own axis. Unit rotating device 92 includes multiple gearwheels (not illustrated) provided at upper ends of multiple mounting units 78, and a single gearwheel (not shown) configured to mesh with the multiple gear wheels, whereby individual mounting units 78 rotate about their own axes simultaneously with the multiple gearwheels being rotated as a result of rotation of the single gearwheel. As a result, postures of the electronic components picked up and held by mounting units 78 can be changed.

Further, rollers 96, functioning as a cam follower, are provided at upper end portions of mounting units 78, and each roller 96 is in engagement with a cam surface of a cam 97 fixed to head main body 88. The cam surface is made to change its height in a circumferential direction. Individual mounting units 78 are held by unit holding body 82 in such a manner as to move in the up-down direction. As a result, mounting units 78 move in the up-down direction along with rotation of unit holding body 82.

Mounting head 25 includes first lifting and lowering device (refer to FIG. 14) 98 configured to move mounting unit 78 in the up-down direction at a first station, which is at a lowest stopping position in multiple stopping positions of mounting unit 78, and second lifting and lowering device 100 configured to move mounting unit 78 in the up-down direction at a second station, which is at a stopping position that differs from the first station in the multiple stopping positions of mounting unit 78. As a result, mounting unit 78, that is, suction nozzle 80 is moved in the up-down direction when an electronic component is mounted, picked up, or the like. Suction nozzle 80 of mounting unit 78 located at the first station mounts an electronic component on a circuit board and picks up and holds an electronic component supplied from first supply device 24. In addition, suction nozzle 80 of mounting unit 78 located at the second station picks up and holds an electronic component supplied from second supply device 27.

Second supply device 27 is a so-called bulk feeder and is fixed to head main body 88 of mounting head 25. As a result, second supply device 27 can be moved to any position on frame section 30 together with mounting head 25 by moving device 23. Second supply device 27 includes component case 106 and component feed device 108. Hereinafter, component case 106 and component feed device 108 will be described in detail.

Figure 3:
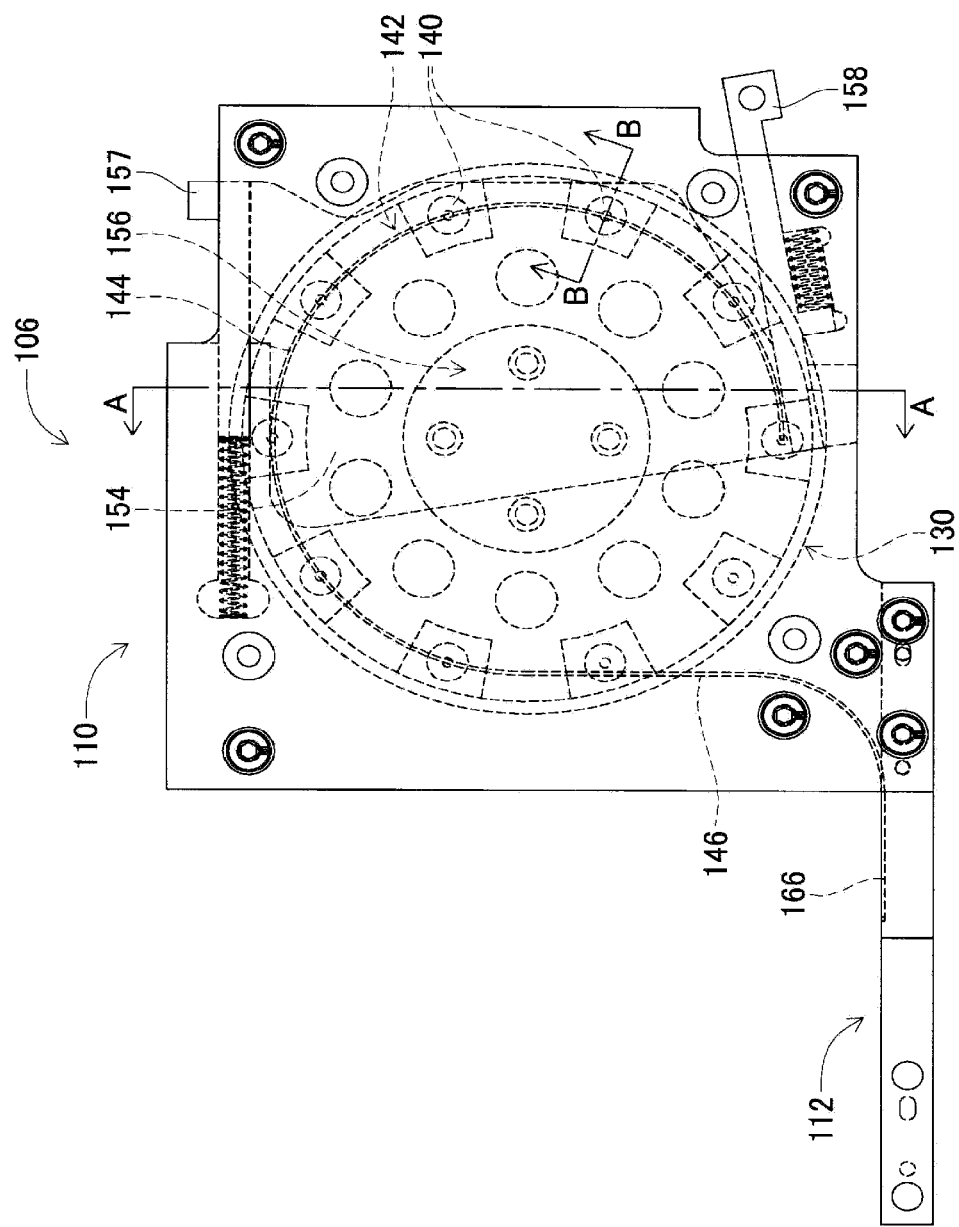
FIG. 3 is a side view showing a component case of the second supply device.
Figure 4:
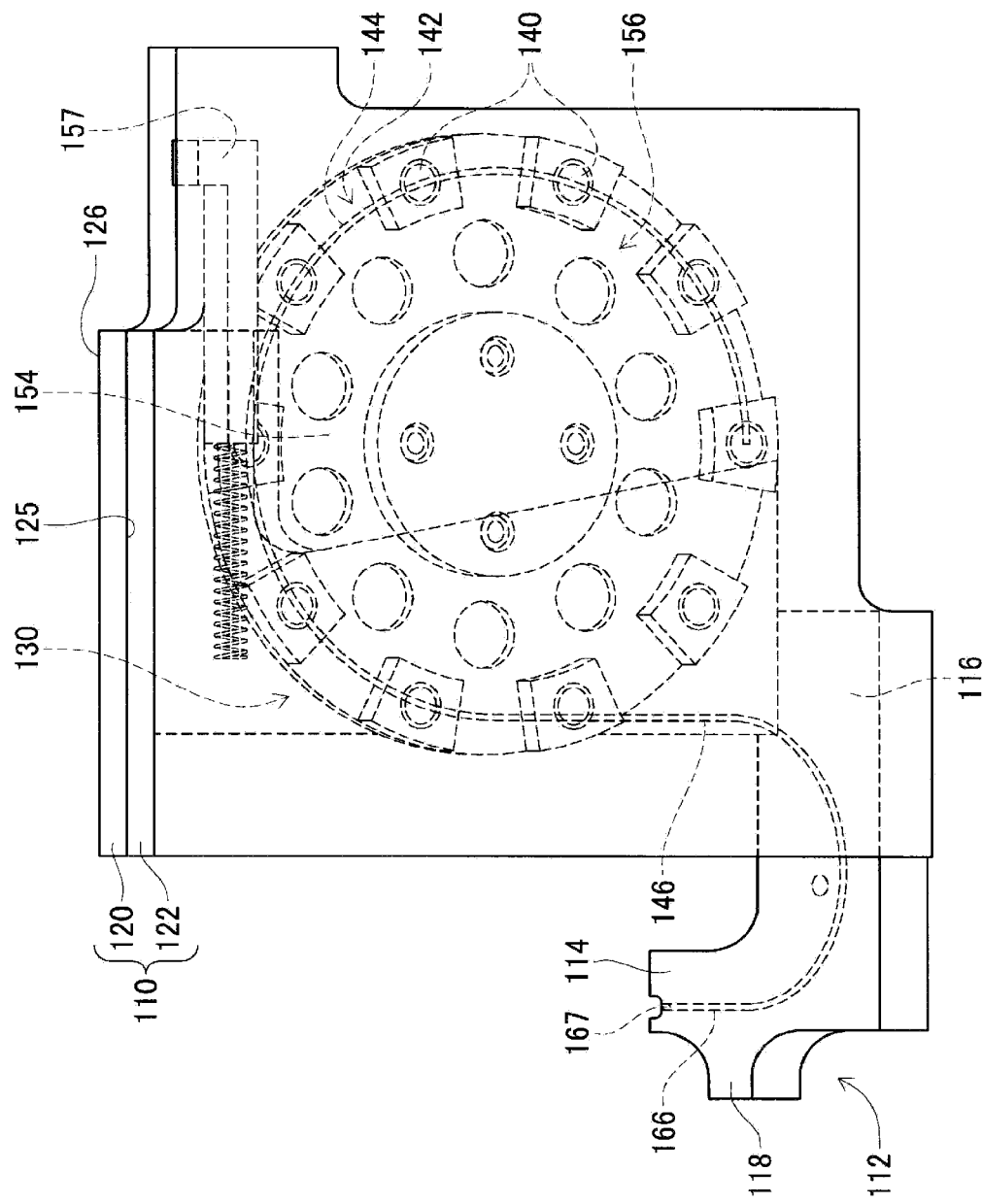
FIG. 4 is a perspective view showing the component case of the second supply device.

As shown in FIGS. 2 to 4, component case 106 includes housing 110 and arm member 112. Arm member 112 is divided into first arm section 114, second arm section 116, and third arm section 118. First arm section 114 extends towards below suction nozzles 80 of mounting units 78, which are lifted and lowered by second lifting and lowering device 100. Second arm section 116 is orthogonal to first arm section 114 in the same plane, and third arm section 118 is orthogonal to first arm section 114 in the same plane and extends in a direction opposite to second arm section 116. Arm member 112 is fixed to a lower face of housing 110 at second arm section 116.

Figure 5:
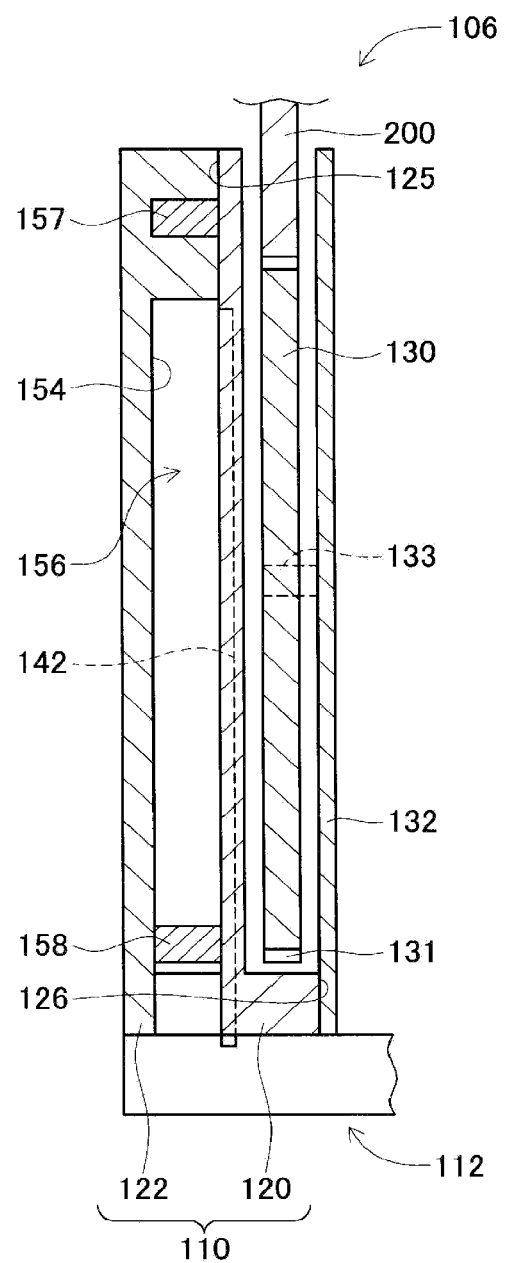
FIG. 5 is a cross-sectional view taken along a line A-A shown in FIG. 3.

Housing 110 includes first case member 120 and second case member 122. First case member 120 and second case member 122 are in the form of thick plates and raised while being brought into face-to-face contact with each other. As shown in FIG. 5, which is a cross-sectional view taken along the line A-A in FIG. 3, recessed section 128 is formed on surface 126 of first case member 120 which is located on an opposite side to mating surface 125 that is brought into contact with second case member 122. Turntable 130 is disposed in an interior of recessed section 128. Multiple teeth 131 are formed on an outer circumferential portion of turntable 130 at equal intervals. Recessed section 128 where to accommodate turntable 130 is opened at an upper end of first case member 120.

Figure 6:
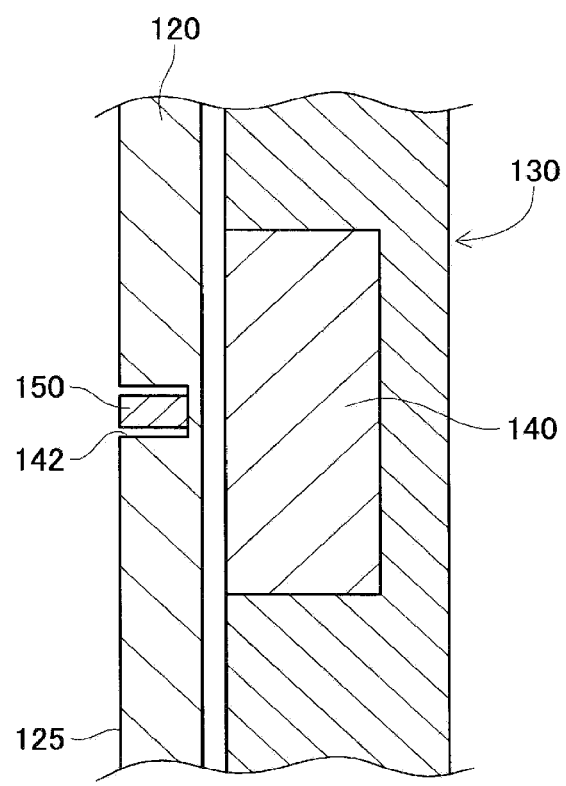
FIG. 6 is a cross-sectional view taken along a line B-B shown in FIG. 3.

Turntable 130 has a circular disk shape and is supported rotatably by shaft 133 fixed to flat plate-shaped support member 132. Support member 132 is fixed to head main body 88 of mounting head 25, as will be described later. As shown in FIG. 6, which is a cross-sectional view taken along the line B-B in FIG. 3, permanent magnet 140 is embedded in a surface of turntable 130 facing first case member 120. As shown in FIG. 3, 10 permanent magnets 140 are embedded in turntable 130 in positions lying near an outer edge portion of turntable 130, and 10 permanent magnets 140 are disposed at 10 equal intervals.

Groove 142 is formed on mating surface 125 of first case member 120. As shown in FIG. 3, groove 142 is divided into annular groove section 144 and up-down groove section 146. Annular groove section 144 has a partially annular shape centered at a rotation axis of turntable 130. Up-down groove section 146 continues from an end portion of annular groove section 144 and extends generally in an up-down direction.

Annular groove section 144 is formed in a position that follows a rotational locus of permanent magnets 140 that is produced in association with rotation of turntable 130.

Annular groove section 144 extends from a lowest end of the rotational locus of permanent magnets 140 in a forward rotational direction of turntable 130 and reaches a frontmost end (an end facing arm member 112) of the rotational locus of permanent magnets 140 by way of an uppermost end of the rotational locus of permanent magnets 140. On the other hand, up-down groove section 146 continues from distal end of annular groove section 144 that starts to extend downwards and continues to extend downwards. Then, up-down groove section 146 curves towards the front (in a direction facing arm member 112) and opens in a front lateral face of first case member 120 in a generally horizontal state.

An electronic component is accommodated in groove 142. As shown in FIG. 6, a depth of groove 142 is slightly deeper than a height of electronic component 150, and a width of groove 142 is slightly larger than a width of electronic component 150. Then, electronic component 150 is accommodated in an interior of groove 142 in such a posture that a width direction of electronic component 150 follows a width direction of groove 142.

Additionally, as shown in FIG. 5, second case member 122 is attached to mating surface 125 of first case member 120. Recessed section 154 is formed on a surface of second case member 122 that is placed on first case member 120. As shown in FIG. 3, recessed section 154 has a generally semicircular shape and covers a portion of annular groove section 144, specifically, a portion extending to the rear from a lowermost end to reach an uppermost end of annular groove section 144. Then, second case member 122 and first case member 120 are placed on each other in such a manner as to cover recessed section 154 of second case member 122. As a result, storage section 156 is defined by recessed portion 154 of second case member 122 and mating surface 125 of first case member 120, and an electronic component is accommodated in storage section 156.

Storage section 156 where to store an electronic component opens in an upper face and a lower face of second case member 122, and shutters 157 and 158 are provided for the openings. Shutters 157 and 158 can be opened and closed, whereby storage section 156 can be replenished with electronic components by opening shutter 157, while electronic components can be fed out from storage section 156 to an exterior of component case 106 by opening shutter 158.

As shown in FIG. 4, groove 166 is formed on an upper face of arm member 112. A proximal end portion of groove 166 is connected to a distal end portion of up-down groove section 146 that is formed on first case member 120. Groove 166 is curved towards first arm section 114 and extends to an end face of first arm section 114. Stopping member 167 is provided to rise in an interior of groove 166 located near the end face of first arm section 114, whereby an electronic component fed out through the interior of groove 166 is stopped by stopping member 167. That is, the location where stopping member 167 is provided to rise constitutes a supply position of an electronic component by second supply device 27.

Component case 106 can be detachably mounted on head main body 88 of mounting head 25. Specifically, as shown in FIG. 2, mounting section 180 where to mount component case 106 is formed on head main body 88 of mounting head 25. Mounting section 180 forms a space slightly larger than external dimensions of housing 110 of component case 106 and opens to a lower end face of head main body 88. Then, housing 110 of component case 106 is inserted into mounting section 180 from an opening in the lower end face of head main body 88, whereby component case 106 is mounted in mounting section 180.

Component case 106 is locked by a pair of clamping devices 184 and 186 in such a state that component case 106 is mounted in mounting section 180. Specifically, clamping devices 184 and 186 are disposed on head main body 88 of mounting head 25, and clamping device 184 faces a distal end portion of arm member 112 of component case 106 mounted in mounting section 180, while clamping device 186 faces an opposite end portion of component case 106 mounted in mounting section 180 to arm member 112.

Figure 7:
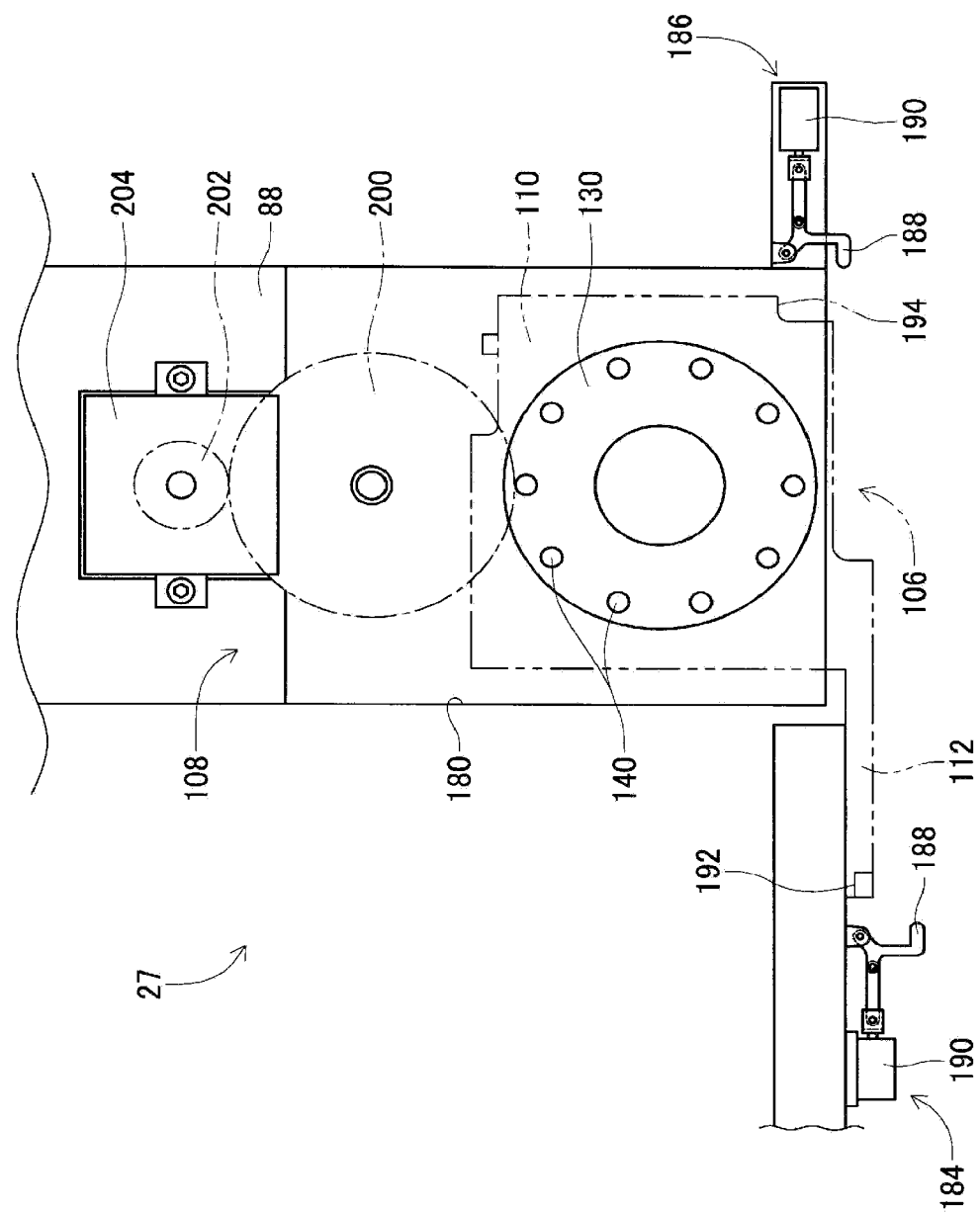
FIG. 7 is a side view showing the second supply device.

As shown in FIG. 7, clamping devices 184 and 186 each have clamping claw 188 and air cylinder 190. Clamping claw 188 of clamping device 184 is disposed rotatably towards a distal end portion of arm member 112 of component case 106 mounted in mounting section 180, and clamping claw 188 of clamping device 186 is disposed rotatably towards an end portion of component case 106 mounted in mounting section 180 that lies opposite to the side of component case 106 that faces arm member 112. Then, when respective air cylinders 190 of clamping devices 184 and 186 extend, clamping claws 188 of clamping devices 184 and 186 rotate towards component case 106, and when respective air cylinders 190 of clamping devices 184 and 186 contract, clamping claws 188 of clamping devices 184 and 186 rotate in a direction in which clamping claws 188 move away from component case 106.

Figure 8:
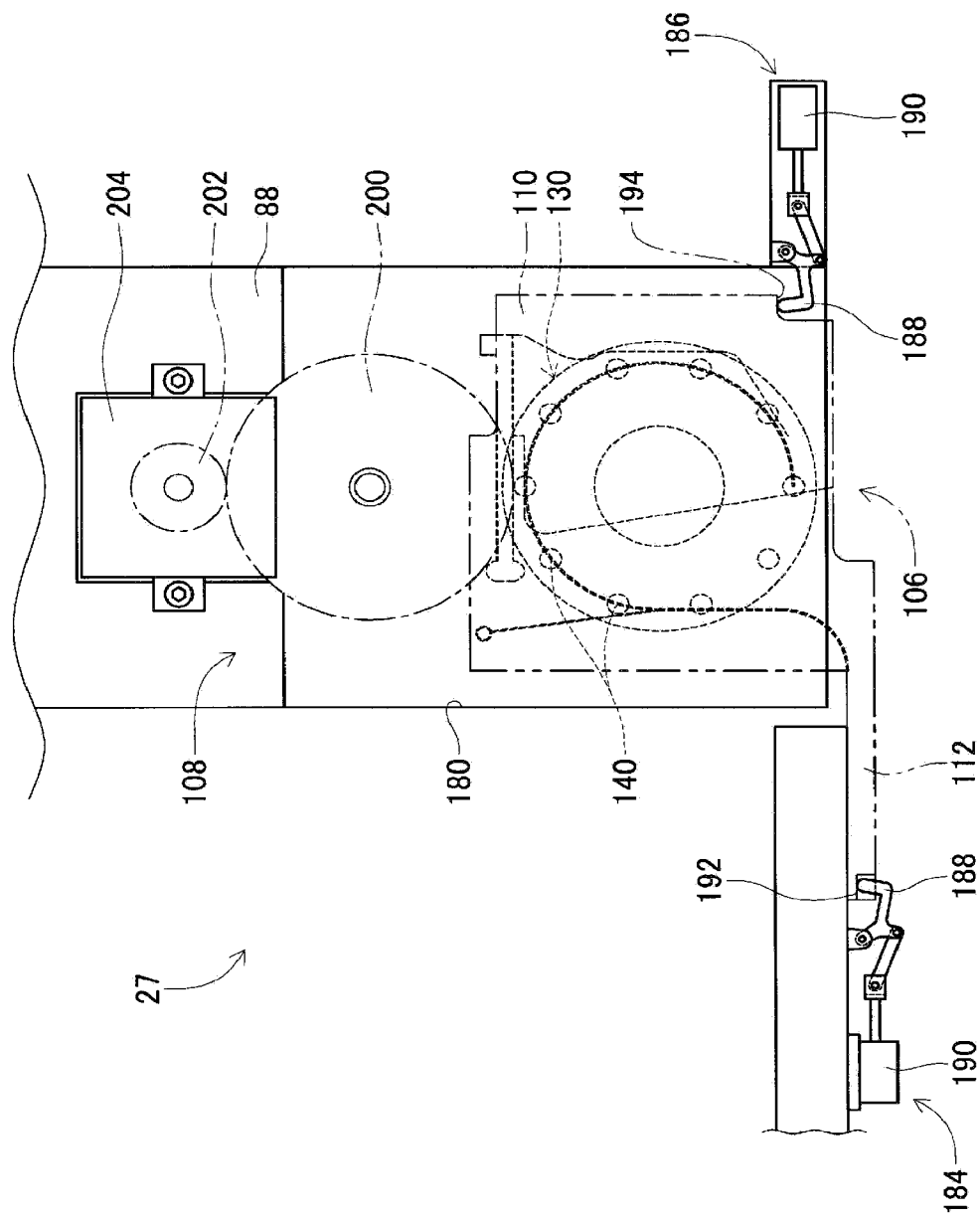
FIG. 8 is a side view showing the second supply device.

In the structure described above, when respective air cylinders 190 of clamping devices 184 and 186 extend, as shown in FIG. 8, clamping claw 188 of clamping device 184 comes into engagement with engagement section 192 formed at the front end portion of arm member 112 of component case 106, while clamping claw 188 of clamping device 186 comes into engagement with engagement section 194 formed at a rear end portion of housing 110 of component case 106. As a result, component case 106 is locked by a pair of clamping devices 184 and 186 in such a state that component case 106 is mounted in mounting section 180. Further, when respective air cylinders 190 of clamping devices 184 and 186 contract, the engagement of clamping claw 188 of clamping device 184 with engagement portion 192 is released, and the engagement of clamping claw 188 of clamp device 186 with engagement portion 194 is released, as shown in FIG. 7. As a result, the lock of component case 106 by the pair of clamping devices 184 and 186 is released, whereby component case 106 can be removed from mounting section 180.

Further, in component case 106 mounted in mounting section 180, turntable 130 rotates in association with operation of component feed device 108. Specifically, as shown in FIG. 7, component feed device 108 includes turntable 130 described above, two gears 200 and 202, and electromagnetic motor 204. Turntable 130 is rotatably supported by support member 132 fixed to head main body 88 of mounting head 25 as described above. Gearwheel 200 is rotatably held by head main body 88 of mounting head 25 above mounting section 180 and meshes with teeth 131 of turntable 130 of component case 106 mounted in mounting section 180. Gearwheel 202 is rotatably held by head main body 88 above gearwheel 200 and meshes with gearwheel 200. Then, gearwheel 202 is rotated by driving electromagnetic motor 204. As a result, in component case 106 mounted in mounting section 180, turntable 130 rotates in association with operation of component feed device 108. Turntable 130 rotates counterclockwise in FIG. 3 in association with operation of component feed device 108, and the rotating direction then may be referred to as a forward rotational direction of turntable 130.

According to the structure described above, in second supply device 27, electronic components stored loosely in storage section 156 are aligned into a single line in groove 142 and groove 166 and are fed to the supply position. Specifically, in groove 142 formed on housing 110 of component case 106, part of annular groove section 144 of groove 142 is covered by recessed section 154 of second case member 122. Due to this, the part of annular groove section 144 covered by recessed section 154 opens to an interior of recessed section 154, that is, to storage section 156. As described above, annular groove section 144 is formed along the rotational locus of permanent magnets 140. Due to this, electronic components stored in storage section 156 are accommodated into an interior of annular groove section 144 by means of a magnetic force of permanent magnets 140. Then, when turntable 130 rotates in the forward rotational direction as a result of operation of component feed device 108, electronic components accommodated in annular groove section 144 move in the rotational direction of turntable 130. At this time, multiple electronic components is aligned into a single line in the interior of annular groove section 144.

When turntable 130 rotates further in the forward rotational direction, the electronic components in annular groove section 144 are fed out toward up-down groove section 146. Then, the electronic components fed out into up-down groove section 146 move downward by gravity. Thus, the electronic components fed out into up-down groove section 146 pass through the interior of up-down groove section 146 to be fed out into groove 166 of arm member 112. The electronic components fed out into groove 166 are further fed out towards an end face of first arm section 114 to come into contact with stopping member 167 provided to rise in the interior of groove 166. In this manner, in component case 106 mounted in mounting section 180, multiple electronic components stored loosely therein are aligned into the single line to be fed out to the supply position. Then, the electronic components fed out to the supply position are picked up and held by mounting units 78 that are lifted or lowered by second lifting and lowering device 100, that is, by suction nozzles 80 of mounting units 78 located at the second station.

Figure 9:
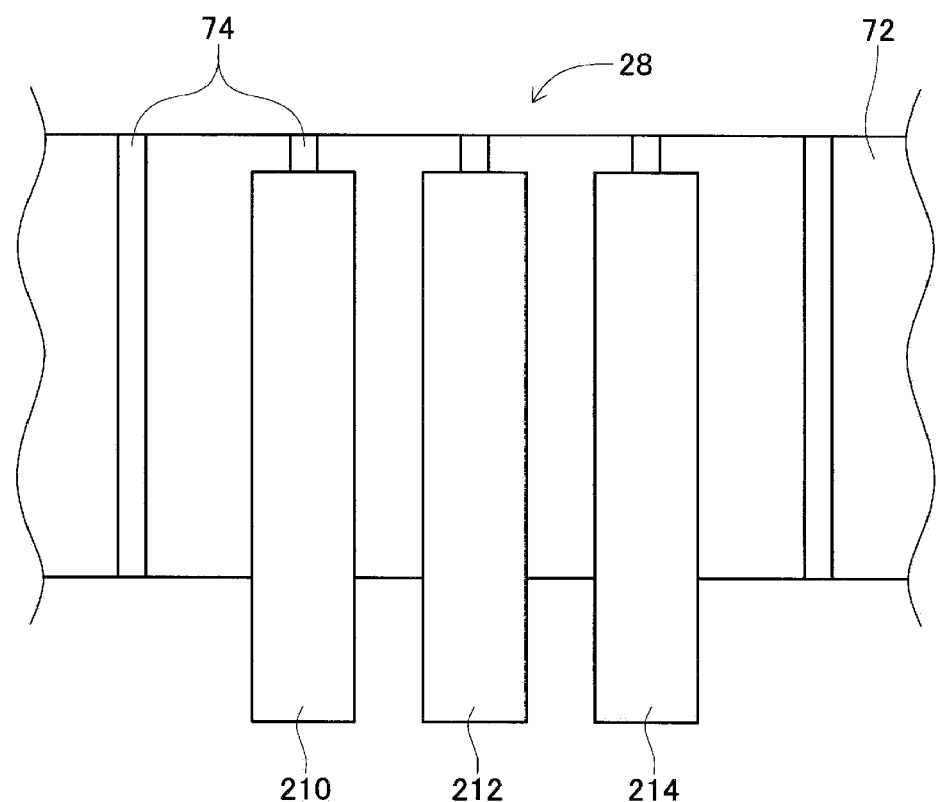
FIG. 9 is a schematic view showing a case exchange unit.

Case exchange unit 28 is a unit configured to exchange component case 106 mounted in mounting section 180 of second supply device 27 with another component case 106 and includes three case exchanging devices 210, 212, and 214, as shown in FIG. 9. Case exchanging devices 210, 212, and 214 are detachably mounted on rails 74 on loading base 72 on which tape feeders 70 are mounted. Since case exchanging devices 210, 212, and 214 have the same structure, case exchanging device 210 will be described below as representing the case exchanging devices.

Figure 10:
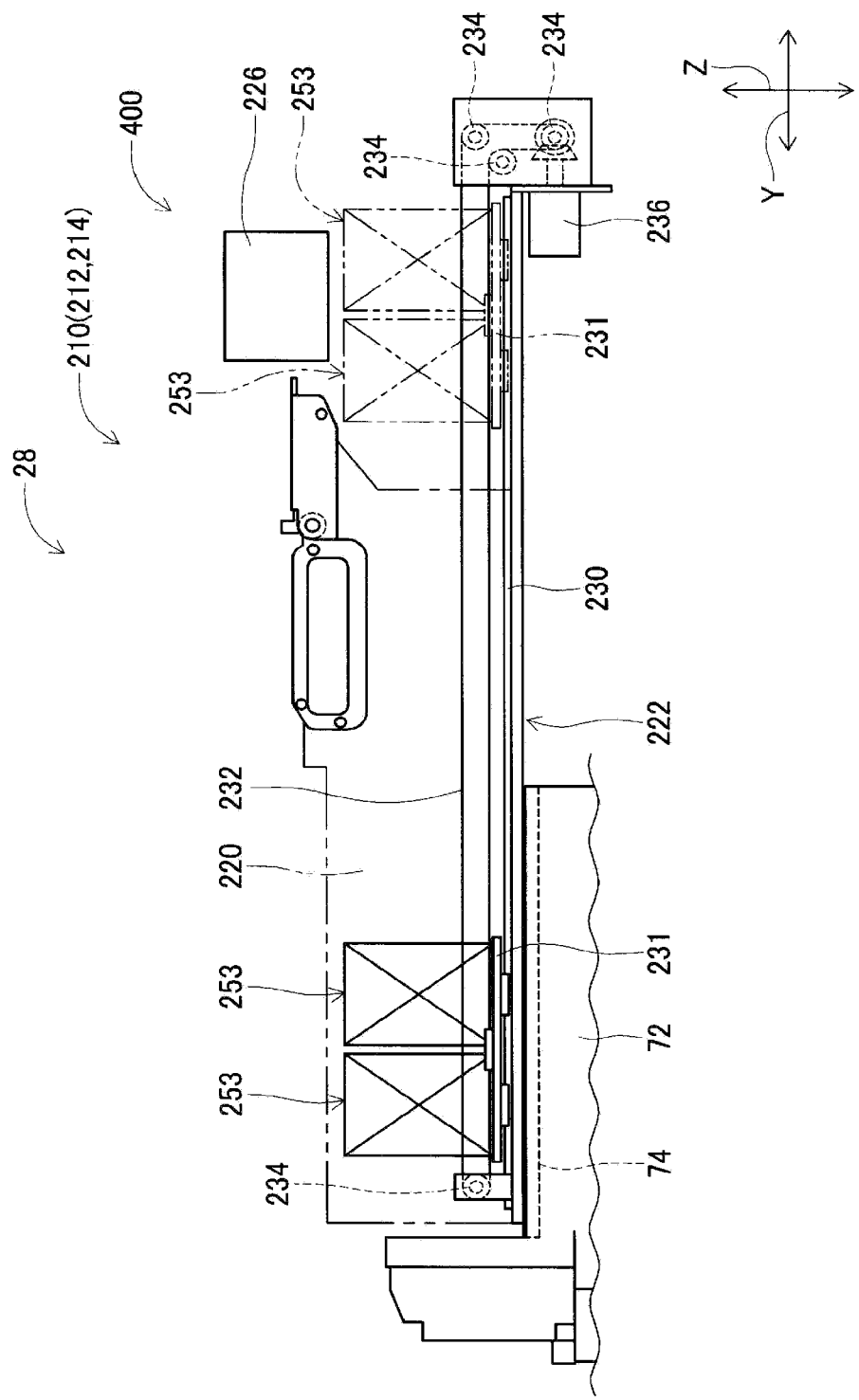
FIG. 10 is a side view showing a case exchanging device of the case exchange unit.

Case exchanging device 210 includes exchanging device main body 220, case moving device 222, case lifting and lowering unit (refer to FIGS. 11 and 12) 224, and component replenishing device 226, as shown in FIG. 10.

Exchanging device main body 220 has a generally rectangular box shape and is detachably mounted on rail 74 of loading base 72 on which tape feeders 70 are mounted. Case moving device 222 includes guide rail 230, slider 231, endless belt 232, multiple pulleys 234, and electromagnetic motor 236. Guide rail 230 is disposed in such a manner so as to extend in a longitudinal direction of exchanging device main body 220, that is, the Y-axis direction, in an interior of exchange device main body 220, and slider 231 is slidably held by guide rail 230. Endless belt 232 is disposed in such a manner as to extend in the Y-axis direction, and is wound around multiple pulleys 234 at both end portions thereof. Of multiple pulleys 234, one pulley 234 is rotated by driving electromagnetic motor 236. Slider 231 is brought into engagement with endless belt 232. According to this structure, when pulley 234 is rotated together with endless belt 232 by driving electromagnetic motor 236, slider 231 moves between a case exchanging position (a position where slider 231 is indicated by solid lines in FIG. 10) and a replenishing position (a position where slider 231 is indicated by chain double-dashed lines in FIG. 10) in the interior of exchanging device main body 220.

Figure 11:
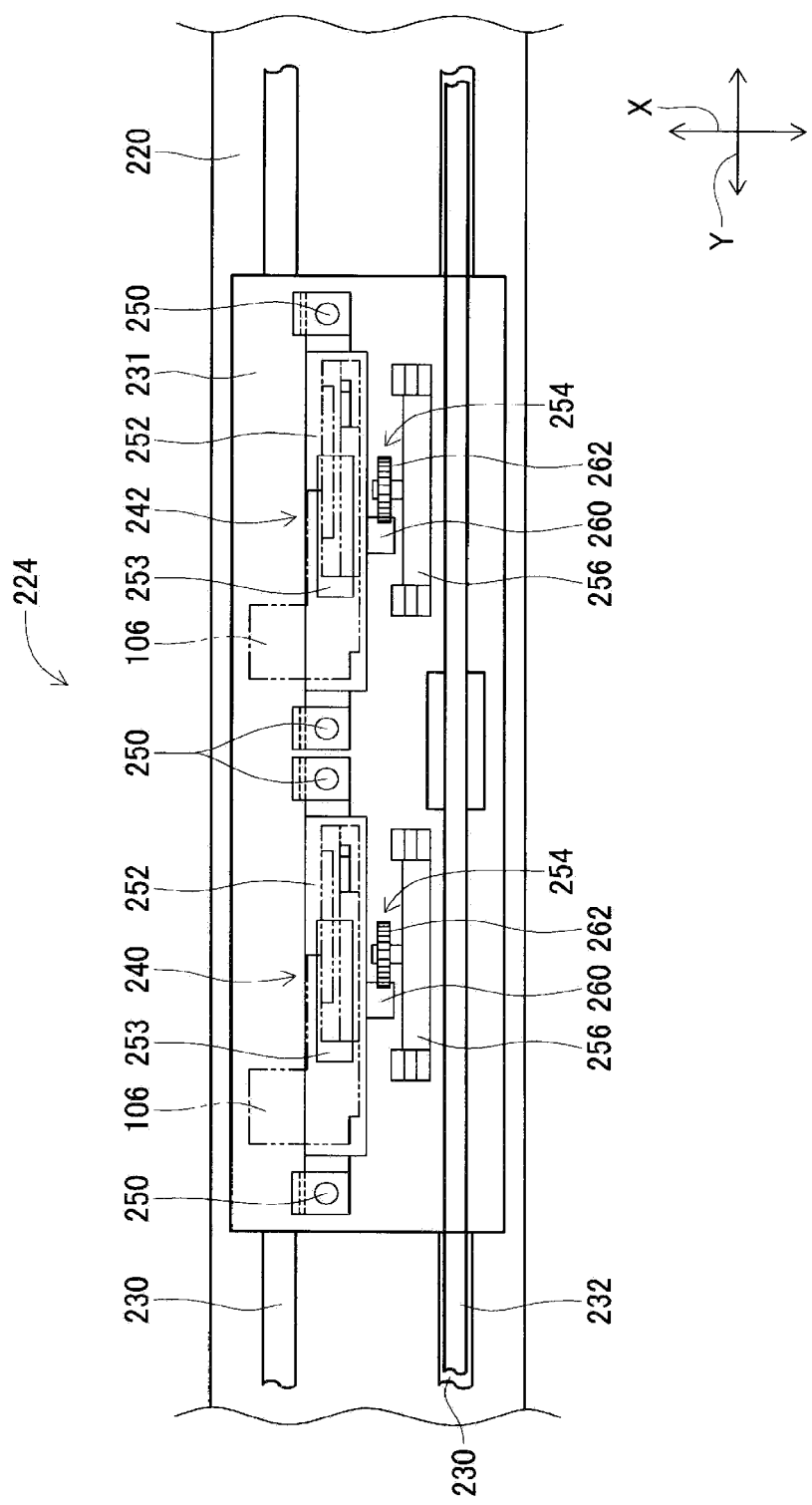
FIG. 11 is a plan view showing the case exchanging device.
Figure 12:
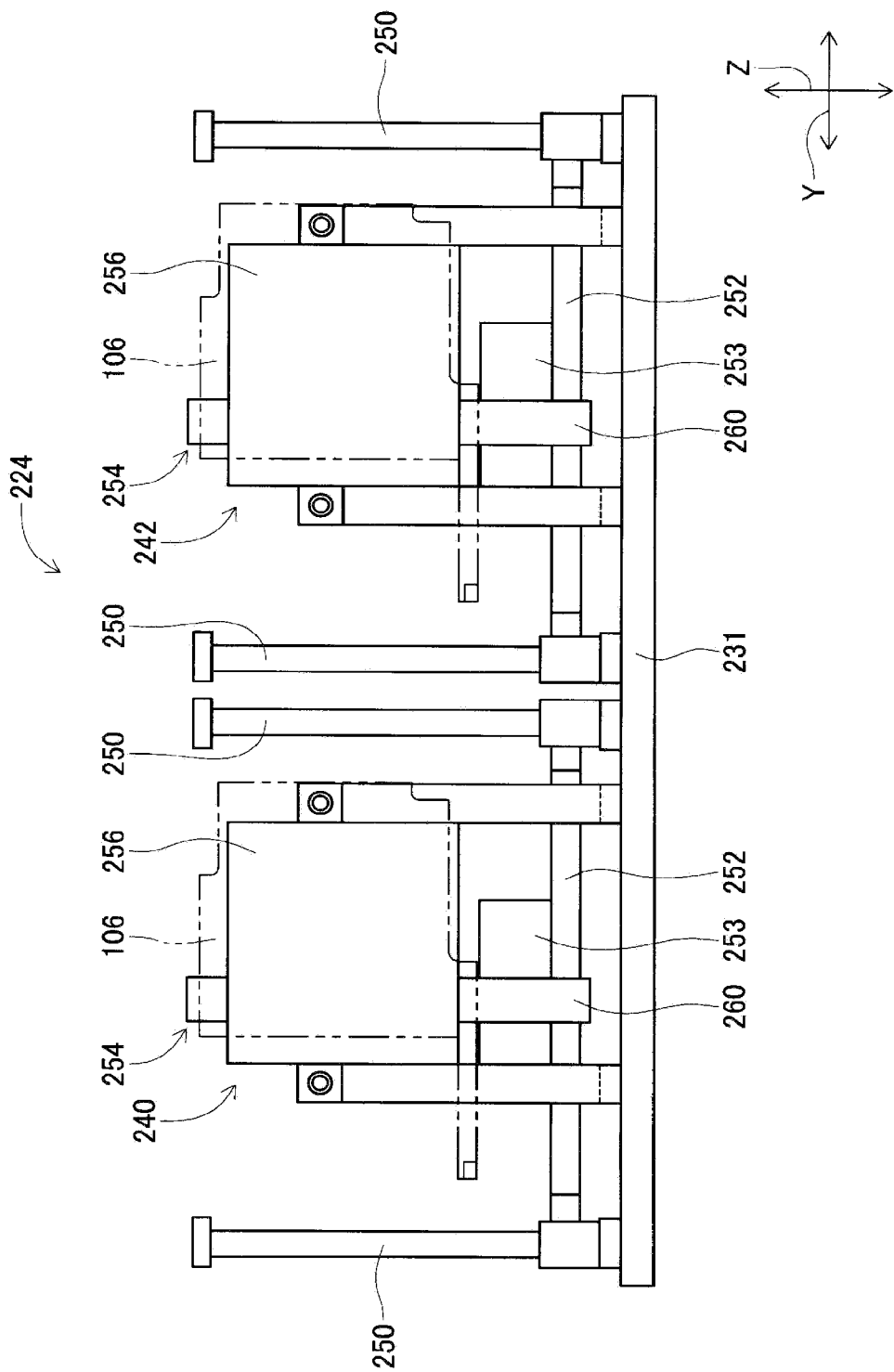
FIG. 12 is a side view showing the case exchanging device.

As shown in FIGS. 11 and 12, case lifting and lowering unit 224 includes a pair of case lifting and lowering devices 240 and 242. The pair of case lifting and lowering devices 240 and 242 are disposed in such a manner as to be aligned side by side in the Y-axis direction on an upper face of slider 231. As for case lifting and lowering devices 240 and 242, each includes a pair of guide rods 250, lifting and lowering base 252, case holding section 253, lifting and lowering mechanism 254, and electromagnetic motor 256.

Figure 13:
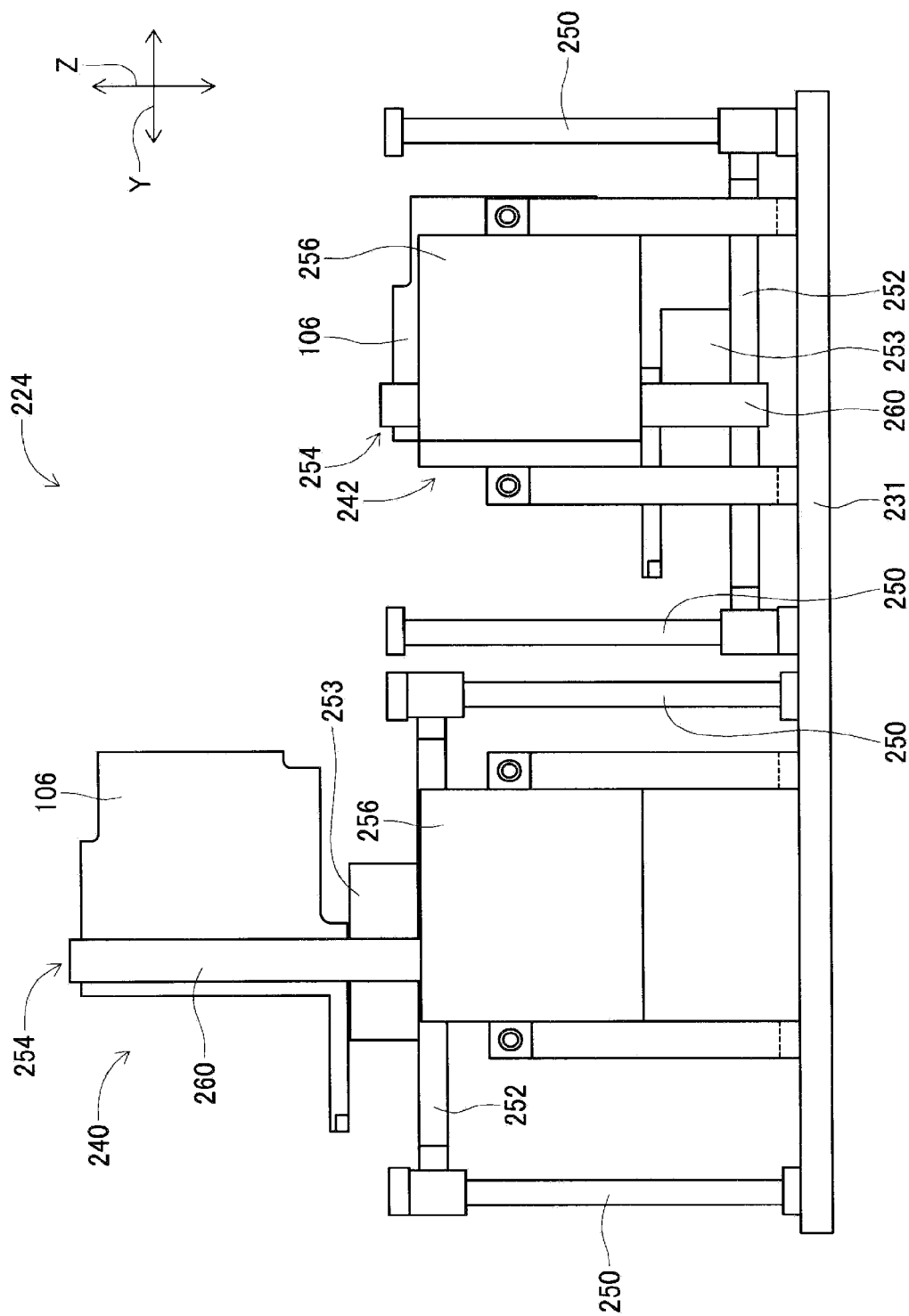
FIG. 13 is a side view showing the case exchanging device.

The pair of guide rods 250 are provided to rise on the upper face of slider 231 while being spaced apart from each other in the Y-axis direction, and lifting and lowering base 252 is held slidably in the up-down direction by the pair of guide rods 250. Case holding section 253 holds component case 106 and is fixed to an upper face of lifting and lowering base 252. Lifting and lowering mechanism 254 includes rack 260 and pinion 262. Rack 260 is fixed to lifting and lowering base 252 with a posture extending in the up-down direction, and pinion 262 is brought into meshing engagement with rack 260. Then, pinion 262 is rotated by driving electromagnetic motor 256. According to this structure, in each of case lifting and lowering devices 240 and 242, rack 260 is lifted or lowered in association with rotation of pinion 262, whereby lifting and lowering base 252 fixed to rack 260 is lifted or lowered together with case holding section 253. FIG. 13 shows a state in which component case 106 held by case holding section 253 is raised by case lifting and lowering device 240 of the pair of case lifting and lowering devices 240 and 242.

As shown in FIG. 10, component replenishing device 226 is disposed above slider 231 that has moved to a replenishing position. Component replenishing device 226 is configured to open shutter 157 of component case 106, to introduce electronic components into storage section 156 from the opening formed by opening shutter 157 and to replenish component case 106 held by case holding section 253 of slider 231 staying in the replenishing position with electronic components.

By adopting this structure, in case exchanging device 210 of case exchange unit 28, component case 106 is transferred between mounting section 180 of second supply device 27 and case holding section 253 of case exchanging device 210, and component case 106 transferred from second supply device 27 is replenished with electronic components.

Specifically, when component case 106 is transferred from mounting section 180 of second supply device 27 to case holding section 253 of case exchanging device 210, the slider 231 in case exchanging device 210 is moved to the case exchanging position with component case 106 being not held by at least one case holding section 253 of the pair of case holding sections 253. In second supply device 27, component case 106 is mounted in mounting section 180, and second supply device 27 is moved in such a manner that mounting section 180 is positioned above case holding section 253 that does not hold component case 106 of case exchanging device 210.

Next, in case exchanging device 210, lifting and lowering base 252 of case holding section 253 positioned below mounting section 180 is raised. At this time, in second supply device 27, clamping devices 184 and 186 operate, causing clamping claws 188 to rotate in a direction in which clamping claws 188 move away from component case 106, whereby the locking of component case 106 by clamping claws 188 is released. As a result, component case 106 mounted on mounting section 180 is transferred to case holding section 253 of case exchanging device 210, and the component case 106 is then held by case holding portion 253. Then, lifting and lowering base 252 of case holding section 253 that holds component case 106 is lowered.

When component case 106 is transferred from case holding section 253 of case exchanging device 210 to mounting section 180 of second supply device 27, slider 231 in case exchanging device 210 is moved to the case exchanging position with component case 106 being held by at least one case holding section 253 of the pair of case holding sections 253. With no component case 106 mounted in mounting section 180 in second supply device 27, second supply device 27 is moved so that mounting section 180 is positioned above case holding section 253 that holds component case 106 of case exchanging device 210.

Then, in case exchanging device 210, lifting and lowering base 252 of case holding section 253 that is positioned below mounting section 180 is raised, and component case 106 held by that case holding section 253 is inserted into an interior of mounting section 180 of second supply device 27. At this time, in second supply device 27, clamping devices 184 and 186 operate, so that clamping claws 188 rotate in a direction in which clamping claws 188 move towards component case 106, whereby component case 106 is locked by clamping claws 188. As a result, component case 106 is mounted in mounting section 180. Then, lifting and lowering base 252 of case holding section 253 that has transferred component case 106 to mounting section 180 is lowered after component case 106 is mounted in mounting section 180.

In replenishing component case 106 transferred from second supply device 27 with electronic components, slider 231 is moved from the case exchanging position to the replenishing position after component case 106 is transferred from mounting section 180 of second supply device 27 to case holding section 253 in the case exchanging position. Then, in the replenishing position, component replenishing device 226 opens shutter 157 of component case 106 transferred from mounting section 180, and introduces electronic components into storage section 156 from the opening formed when shutter 157 is opened. As a result, component case 106 transferred from second supply device 27 is replenished with electronic components.

Incidentally, electronic components supplied by component replenishing device 226 of case exchanging device 210 for replenishment of component case 106 differ from electronic components supplied by component replenishing device 226 of case exchanging device 214 for replenishment of component case 106, and electronic components supplied by component replenishing device 226 of case exchanging device 210 are referred to as A components, while electronic components supplied by component replenishing device 226 of case exchanging device 214 are referred to as B components. In addition, although case exchanging device 212 will be described in detail later, since case exchanging device 212 is used as a device configured only to rest component case 106 thereon, case exchanging device 212 is not involved in replenishing component case 106 with electronic components, although case exchanging device 212 includes component replenishing device 226. To distinguish case exchange devices 210, 212, and 214 from one another, case exchange device 210 may be referred to as first exchange device 210, case exchange device 212 may be referred to as second exchange device 212, and case exchange device 214 may be referred to as third exchange device 214.

Figure 14:
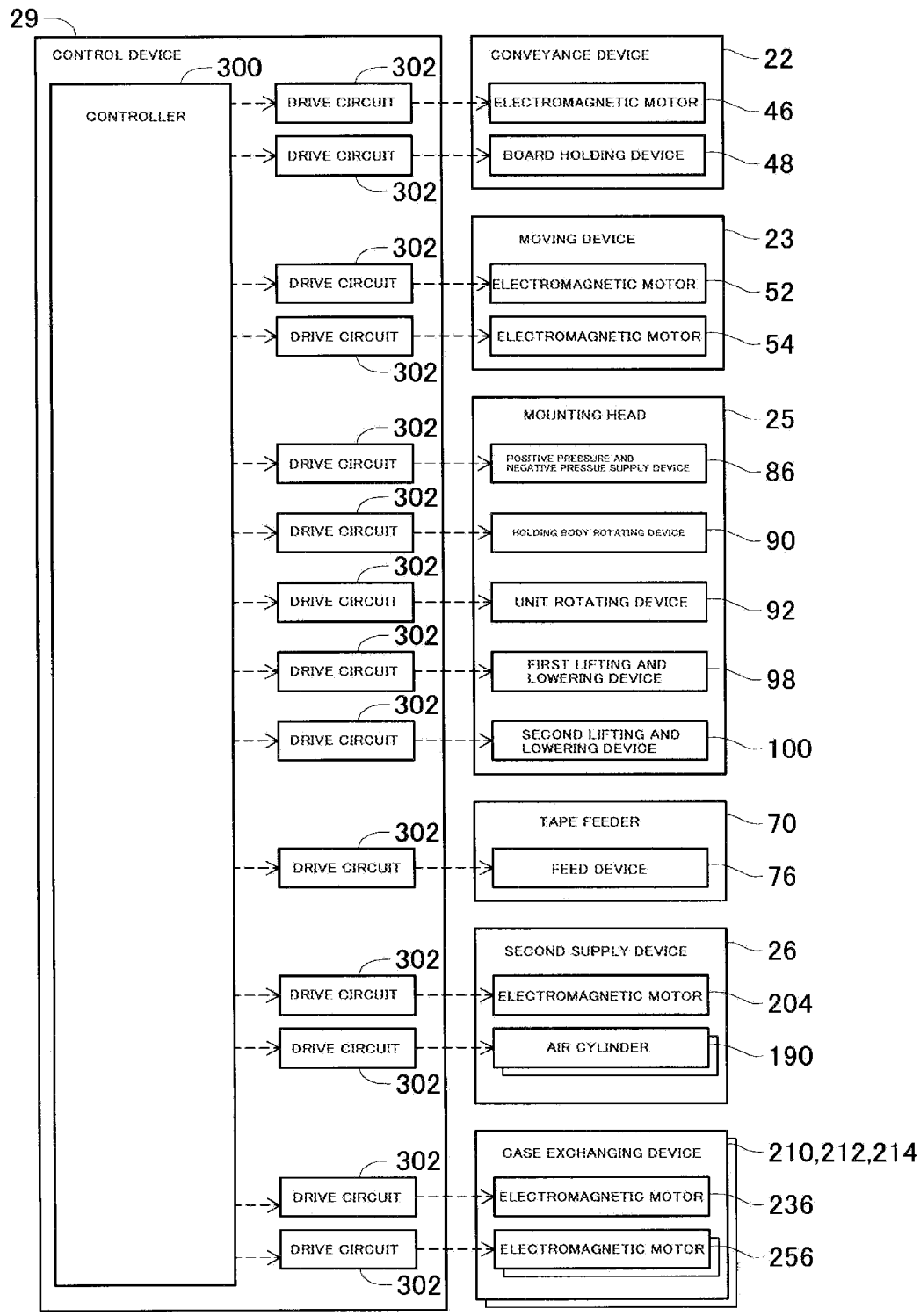
FIG. 14 is a block diagram showing a control device.

As shown in FIG. 14, control device 29 includes controller 300 and multiple drive circuits 302. Multiple drive circuits 302 are connected to electromagnetic motors 46, 52, 54, 204, 236, and 256, board holding device devices 48, feed device 76, positive and negative pressure supply device 86, holding body rotating device 90, unit rotating device 92, first lifting and lowering device 98, second lifting and lowering device 100, and air cylinders 190. Controller 300 includes a CPU, a ROM, a RAM, and the like and is composed mainly of a computer, being connected to multiple drive circuits 302. As a result, the operations of conveyance device 22, moving device 23, and the like are controlled by controller 300.

<Operation of Mounting Machine>

In mounting machine 16, electronic components are mounted on a circuit board held by conveyance device 22 based on the configuration that has been described heretofore. Although mounting machine 16 can mount various types of components on a circuit board, a case will be described below where mounting machine 16 mounts electronic components supplied by second supply device 27.

Specifically, circuit boards are conveyed to a working position by conveyor devices 40 and 42 based on a command from controller 300 and are then held by board holding devices 48 in that position. In second supply device 27, the operation of component feed device 108 is controlled based on a command of controller 300, and electronic components stored in component case 106 are supplied in supply position. Then, mounting units 78 positioned at second station of mounting head 25 are lowered by second lifting and lowering device 100, and electronic components are picked up and held by suction nozzles 80 of mounting units 78. Subsequently, mounting head 25 moves to above the circuit boards and mounts the electronic components held thereby on the circuit boards based on a command from controller 300.

In this manner, in mounting machine 16, electronic components supplied by second supply device 27 are mounted on circuit boards. Additionally, in mounting machine 16, as described above, component case 106 can be replenished with A components in first exchanging device 210 of case exchange unit 28, and component case 106 can be replenished with B components in third exchanging device 214. In case exchange unit 28, therefore, as to component cases 106 that are mounted in mounting section 180 of second supply device 27, component case 106 storing A components and component case 106 storing B components are selectively mounted in mounting section 180 so as to mount an A component and a B component on a circuit board.

Specifically, a case will be described below in which with component case 106 accommodating A components (hereinafter sometimes also referred to as an "A component storage case") mounted in mounting section 180 of second supply device 27, A component accommodating case 106 is exchanged for component case 106 accommodating B components (hereinafter sometimes also referred to as a "B component storage case") after completion of mounting A components on circuit boards.

Firstly, in first exchanging device 210 of case exchange unit 28, with one of the pair of case holding sections 253 holding no component case 106, slider 231 is moved to the case exchanging position. In third exchanging device 214, with one case holding section 253 of the pair of case holding sections 253 holding B component accommodating case 106, slider 231 is moved to the case exchanging position. In second supply device 27, an A component is supplied from A component accommodating case 106 mounted in mounting section 180, and the A component is mounted on the circuit board.

Then, when the mounting of A components is completed, second supply device 27 is moved so that mounting section 180 where A component case 106 is mounted is located above case holding section 253 where component case 106 of first exchanging device 210 is not held. Next, in first exchanging device 210, lifting and lowering base 252 of case holding section 253 located below mounting section 180 is raised. As this occurs, in second supply device 27, component case 106 is released from locking by clamping claws 188, whereby A component accommodating case 106 mounted in mounting section 180 is transferred to case holding section 253 of first exchanging device 210. Then, lifting and lowering base 252 of case holding section 253 that has received A component accommodating case 106 is lowered.

Subsequently, second supply device 27 is moved so that mounting section 180, which is now vacant as a result of the transfer of A component accommodating case 106, is located above case holding section 253 where B component accommodating case 106 of third exchanging device 214 is held. Then, in third exchanging device 214, lifting and lowering base 252 of case holding section 253 located below mounting section 180 is raised, and B component accommodating case 106 held in that case holding section 253 is inserted into an interior of mounting section 180 of second supply device 27. As this occurs, in second supply device 27, B component accommodating case 106 is locked by clamp claws 188, whereby B component accommodating case 106 is mounted in mounting section 180. As a result, A component accommodating case 106 mounted in mounting section 180 is exchanged for B component accommodating case 106. Then, in second supply device 27, a B component is supplied from B component accommodating case 106 and then mounted on the circuit board. As a result, the A component and B component are mounted on the circuit board.

In the case where an A component is mounted after a B component is mounted, B component accommodating case 106 mounted in mounting section 180 is exchanged for A component accommodating case 106. B component accommodating case 106 mounted in mounting section 180 is exchanged for A component accommodating case 106 by a procedure similar to the above procedure for exchanging A component accommodating case 106 mounted in mounting section 180 for B component accommodating case 106. That is, after the mounting of the B components is completed, second supply device 27 is moved to above third exchanging device 214, and in third exchanging device 214, B component accommodating case 106 mounted in mounting section 180 is transferred to case holding section 253 which is vacant. Next, second supply device 27 is moved to above first exchanging device 210, and A component accommodating case 106 transferred from case holding section 253 is mounted in mounting section 180 that is vacant. Then, in second supply device 27, an A component is supplied from A component accommodating case 106, and the A component supplied is mounted on the circuit board.

In this manner, in mounting machine 16, A component accommodating case 106 is transferred in first exchanging device 210, and B component accommodating case 106 is transferred in third exchanging device 214. However, this transfer method for component cases 106 may cause a time loss when component case 106 is replenished with electronic components. Specifically, when component case 106 is mounted in mounting section 180 of second supply device 27 and when the number of electronic components accommodated in component case 106 has decreased to a predetermined number or smaller, component case 106 is exchanged for another component case 106 in first exchanging device 210 or third exchanging device 214. More specifically, a case will be described below in which A component accommodating case 106 is mounted in mounting section 180 of second supply device 27 and the number of A components accommodated in A component accommodating case 106 has decreased to a predetermined number or smaller.

Firstly, in first exchanging device 210, slider 231 is moved to the case exchanging position while component case 106 is not held in one of the pair of case holding sections 253 and A component accommodating case 106 accommodating a sufficient amount of A components is held in the other. Then, when the number of A components stored in A component accommodating case 106 has decreased to the predetermined number or smaller in A component accommodating case 106 mounted in mounting section 180 of second supply device 27, second supply device 27 is moved to above first exchanging device 210, and A component accommodating case 106 mounted in mounting section 180 is transferred to case holding section 253 that is holding no component case 106.

Subsequently, in first exchanging device 210, A component accommodating case 106 is transferred from case holding section 253 that is holding that particular A component accommodating case 106 to mounting section 180 that is now vacant. As a result, A component accommodating case 106 accommodating a sufficient amount of A components is mounted in mounting section 180, which allows mounting of A components on circuit boards. Further, when first exchanging device 210 receives A component accommodating case 106, in which the number of A components accommodated is the predetermined number or smaller, from second supply device 27, slider 231 is moved from the case exchanging position to the replenishing position in first exchanging device 210. In the replenishing position, A component accommodating case 106 in which the number of A components accommodated has decreased to the predetermined number or smaller is replenished with A components from components replenishing device 226. Then, slider 231 is returned from the replenishing position to the case exchanging position.

It should be noted that second supply device 27 continues to supply A components while A component accommodating case 106 is being replenished with A components in first exchanging device 210. In this case, when the mounting of A components on circuit boards is completed, A component accommodating case 106 that is mounted in mounting section 180 needs to be exchanged for B component accommodating case 106. That is, A component accommodating case 106 mounted in mounting section 180 needs to be transferred to case holding section 253 of first exchanging device 210, while B component accommodating case 106 needs to be received by mounting section 180 that is now vacant from case holding section 253 of third exchanging device 214. However, while A component accommodating case 106 is being replenished with A components in first exchanging device 210, slider 231 is moved from the case exchanging position to the replenishing position, and hence, A component accommodating case 106 mounted in mounting section 180 cannot be transferred to case holding section 253 of first exchanging device 210.

In the conventional technique, therefore, when the mounting of A components on circuit boards is completed, second supply device 27 waits until the replenishment with A components is ended in first exchanging device 210 and slider 231 returns to the case exchanging position in order to transfer A component accommodating case 106 mounted in mounting section 180 to case holding section 253 of first exchanging device 210. In this case, no electronic component can be supplied in second supply device 27, so that the mounting is interrupted, which results in a time loss.

In view of this drawback, in mounting machine 16, as the mounting of A components on circuit boards is completed, A component accommodating case 106 mounted in mounting section 180 is transferred to case holding section 253 of second exchanging device 212 in the case where slider 231 is not located in the case exchanging position due to replenishing of A component accommodating case 106 with A components in first exchanging device 210 in the process of exchanging A component accommodating case 106 mounted in mounting section 180 for B component accommodating case 106.

Specifically, in second exchange device 212, slider 231 is moved to the case exchange position with neither of the pair of case holding sections 253 holding component case 106. It should be noted that in second exchanging device 212, slider 231 is not moved from the case exchanging position but is left located in the case exchanging position. Then, second supply device 27, which has completed the mounting of A components on circuit boards, is moved to above second exchanging device 212, so that A component accommodating case 106 is transferred from mounting section 180 of second supply device 27 to one case holding section (hereinafter sometimes also referred to as an "A component case holding section") 253 among the pair of case holding sections 253 of second exchanging device 212.

Subsequently, second supply device 27 is moved to above third exchanging device 214, so that B component accommodating case 106 is transferred from case holding section 253 that is holding B component accommodating case 106 to mounting section 180 that is now vacant. Then, a B component is supplied from second supply device 27 and then mounted on the circuit board. In this manner, when slider 231 is not located in the case exchanging position due to execution of the replenishing of A component accommodating case 106 with A components in first exchanging device 210, A component accommodating case 106 mounted in mounting section 180 is transferred to A component case holding section 253 of second exchanging device 212, whereby the mounting can continue to be executed to thereby prevent the occurrence of a time loss.

When the mounting of B components on circuit boards is completed and B component accommodating case 106 mounted in mounting section 180 is exchanged for A component accommodating case 106, B component accommodating case 106 mounted in mounting section 180 is transferred to case holding section 253 in third exchanging device 214. Then, second supply device 27 is moved to second exchanging device 212, so that A component accommodating case 106 is transferred from A component case holding section 253 to mounting section 180 that is now vacant. Then, A components are supplied in second supply device 27, and A components are mounted on circuit boards.

Further, when B components are mounted after the mounting of A components and when slider 231 has returned to the case exchanging position in first exchanging device 210, A component accommodating case 106 mounted in mounting section 180 is transferred to case holding section 253 of first exchanging device 210. On the other hand, when slider 231 has not returned to the case exchanging position in first exchanging device 210, A component accommodating case 106 mounted in mounting section 180 is transferred to A component case holding section 253 of second exchanging device 212.

That is, second exchanging device 212 is utilized as a temporary resting place for component case 106, and thus, second exchanging device 212 is utilized as a device dedicated only for resting component case 106 thereon and transferring component case 106. Thus, second exchanging device 212 does not execute the replenishment with electronic components without moving slider 231 from the case exchanging position. Thus, when second exchanging device 212 having the same structure as those of first exchanging device 210 and third exchanging device 214 and placed on loading base 72 is utilized as a temporary resting place for A component accommodating case 106, the occurrence of a time loss can be prevented during supply of components for replenishment without developing new equipment.

It should be noted that also when B component accommodating case 106 is mounted in mounting section 180 of second supply device 27 and when the number of B components accommodated in B component accommodating case 106 has decreased to the predetermined number or smaller, B component accommodating case 106 is transferred and replenished with B components in a similar manner to the manner described above in which A component accommodating case 106 is transferred and replenished. That is, in third exchanging device 214, B component accommodating case 106 in which the number of B components accommodated has decreased to the predetermined number or smaller is transferred from mounting section 180 to case holding section 253, and B component accommodating case 106 that accommodates a sufficient amount of B components is mounted from another case holding section 253 to mounting section 180. As a result, B components are mounted on circuit boards in second supply device 27.

On the other hand, in third exchanging device 214, slider 231 is moved from the case exchanging position to the replenishing position, whereby B components are supplied for replenishment. When the mounting of B components on circuit boards is completed in second supply device 27 and when slider 231 has returned to the case exchanging position in third exchanging device 214, B component accommodating case 106 mounted in mounting section 180 is transferred to case holding section 253 of third exchanging device 214, but when slider 231 has not returned to the case exchanging position, B component accommodating case 106 mounted in mounting section 180 is transferred to, of the pair of case holding sections 253 of second exchanging device 212, case holding section (hereinafter sometimes also referred to as a "B component case holding section") 253 that differs from A component case holding section 253. As a result, also when B components are supplied for replenishment, the occurrence of a time loss during replenishment can be prevented as when A components are supplied for replenishment.

Second Embodiment

Figure 15:
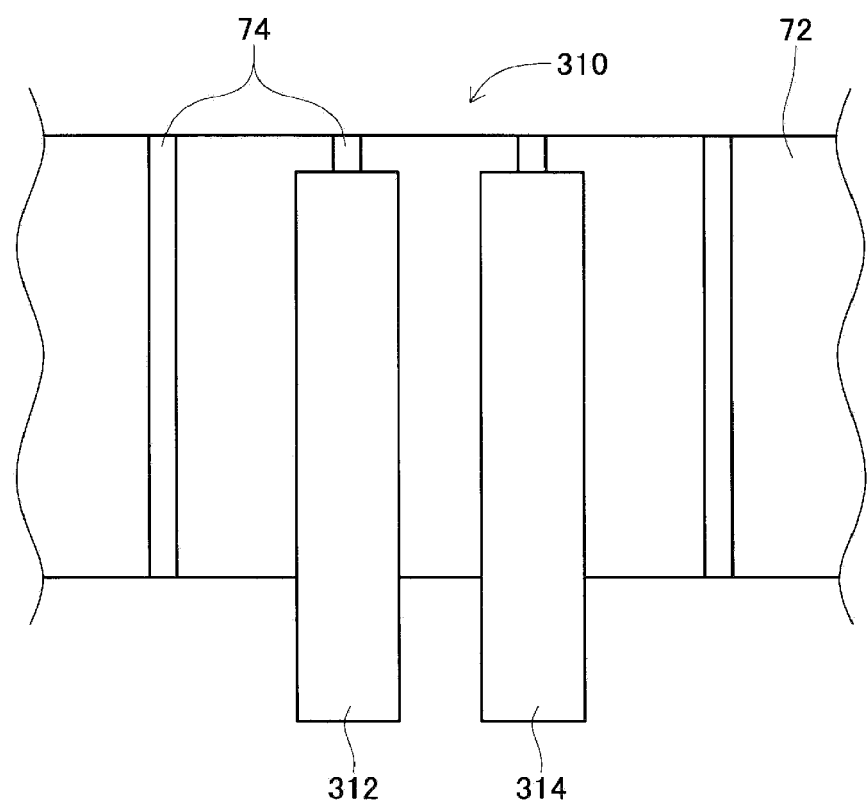
FIG. 15 is a schematic view showing a case exchange unit of a second embodiment.

Although in mounting machine 16 of the first embodiment, case exchange unit 28 includes first exchanging device 210, second exchanging device 212 and third exchanging device 214, in a mounting machine of a second embodiment, as shown in FIG. 15, case exchange unit 310 includes case exchanging device 312 and case exchanging device 314. Since case exchanging devices 312 and 314 have the same structure as that of first exchanging device 210, the description thereof will be omitted here. In component replenishing device 226 of case exchanging device 312, A components are supplied into component case 106, and in component replenishing device 226 of case exchanging device 314, B components are supplied into component case 106. That is, case exchanging device 312 operates like first exchanging device 210 of the first embodiment, and case exchanging device 314 operates like third exchanging device 214 of the first embodiment.

Also in case exchange unit 310 configured as described, the occurrence of a time loss during component replenishment can be prevented. Specifically, for example, when A component accommodating case 106 is mounted in mounting section 180 of second supply device 27 and when the number of A components accommodated in A component accommodating case 106 has decreased to a predetermined number or smaller, A component accommodating case 106 in which the number of components accommodated has decreased to the predetermined number or smaller is transferred from mounting section 180 to case holding section 253 in case exchanging device 312, and A component accommodating case 106 that accommodates a sufficient amount of components is mounted from another case holding section 253 to mounting section 180. As a result, A components are mounted on circuit boards in second supply device 27.

On the other hand, in case exchanging device 312, slider 231 is moved from a case exchanging position to a replenishing position, and A components are supplied for replenishment. When the mounting of A components on circuit boards is completed in second supply device 27 and when slider 231 has returned to the case exchanging position in case exchanging device 312, A component accommodating case 106 mounted in mounting section 180 is transferred to case holding section 253 of case exchanging device 312, but when slider 231 has not returned to the case exchanging position, A component accommodating case 106 mounted in mounting section 180 is transferred to case holding section 253 of case exchanging device 314. This obviates the necessity for interrupting the mounting until slider 231 returns to the case exchanging position when replenishing is carried out in case exchanging device 312, whereby the occurrence of a time loss during component replenishment can be prevented.

Since case exchanging device 314 operates like third exchanging device 214 of the first embodiment does, B component accommodating case 106 is transferred and replenished with B components in case exchanging device 314. That is, in case exchange unit 310 of the second embodiment, case exchanging device 314 is used as a device having two functions including a function originally designed therefor (transfer of B component accommodating case 106 and replenishment with B components) and a function as a temporary resting place for A component accommodating case 106. As a result, the same working effect as that of the first embodiment can be exhibited by two case exchanging devices 312 and 314, and the number of case exchanging devices to be provided can be decreased.

Third Embodiment

Figure 16:
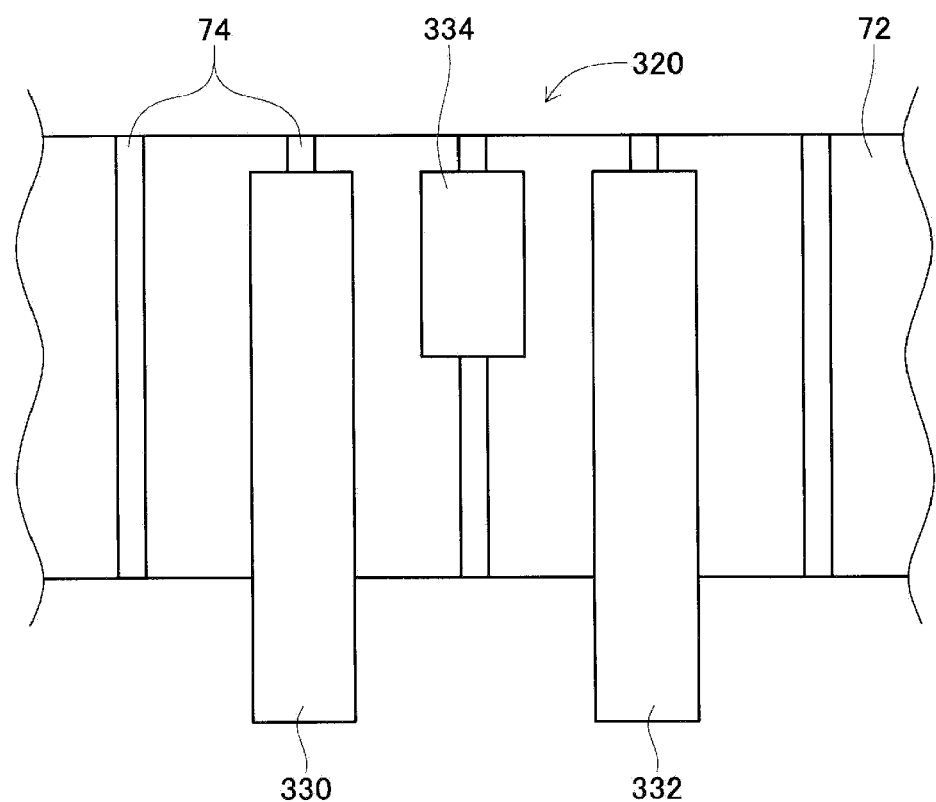
FIG. 16 is a schematic view showing a case exchange unit of a third embodiment.

Case exchange unit 320 of a third embodiment includes case exchanging device 330, case exchanging device 332 and transfer device 334, as shown in FIG. 16. Case exchanging devices 330 and 332 have the same structure as that of first exchanging device 210 of the first embodiment. In component replenishing device 226 of case exchanging device 330, A components are supplied into component case 106, and in component replenishing device 226 of case exchanging device 332, B components are supplied into component case 106. That is, case exchanging device 330 operates like first exchanging device 210 of the first embodiment, and case exchanging device 332 operates like third exchanging device 214 of the first embodiment.

Figure 17:
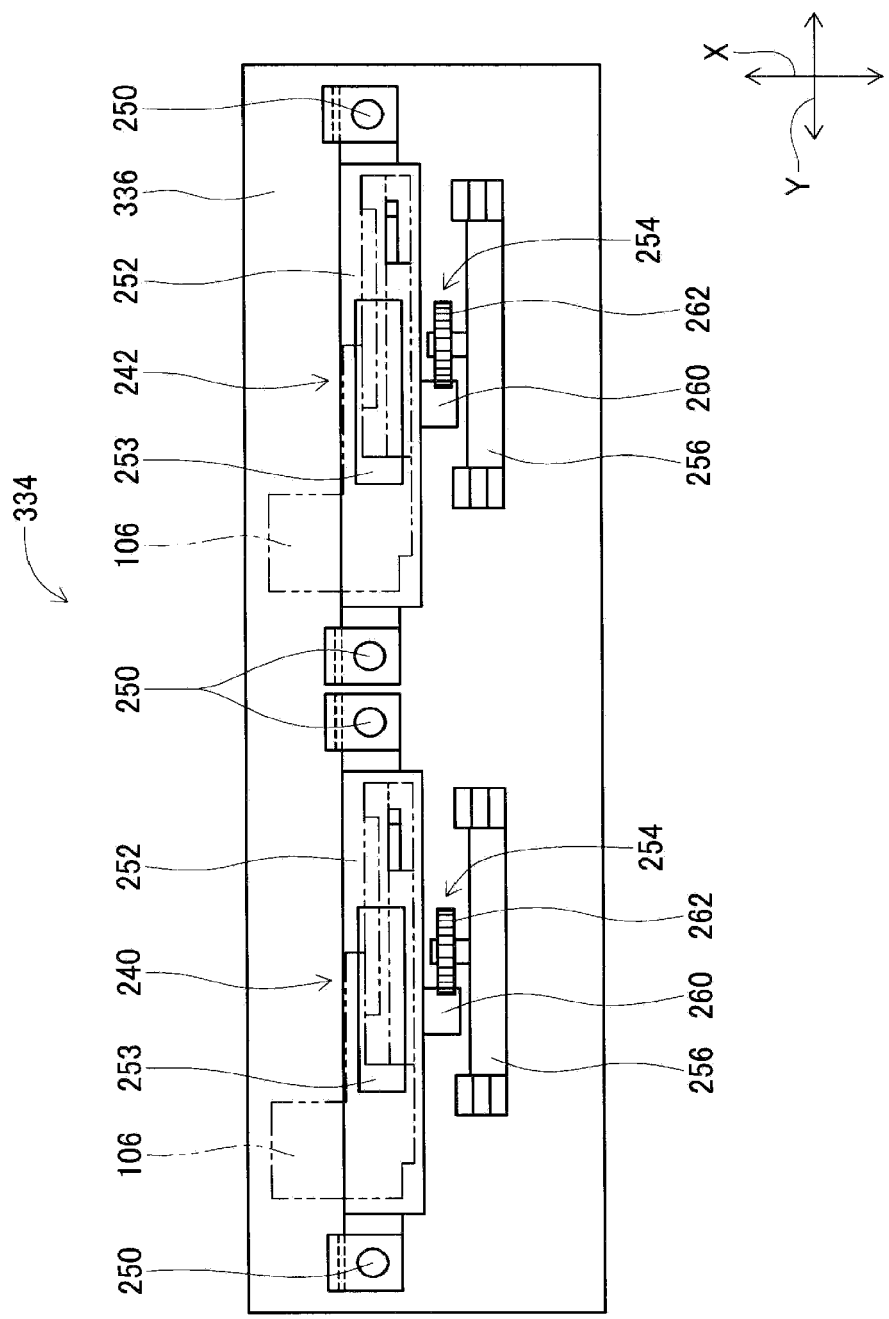
FIG. 17 is a plan view showing a transfer device.

Additionally, transfer device 334 includes base 336 as shown in FIG. 17, and devices, which are the same as those disposed on the upper face of slider 231 of first exchanging device 210 of the first embodiment, are disposed on an upper face of base 336. That is, a pair of case lifting and lowering device devices 240 and 242 of first exchanging device 210 and the like are disposed on the upper face of base 336. Due to this, being different from first exchanging device 210, transfer device 334 does not include the case moving device 222 and the component replenishing device 226 and cannot supply components for replenishment, and thus transfer device 334 is dedicated for transferring component case 106. The reference signs used for the devices disposed on the upper face of slider 231 of first exchanging device 210 are used as reference signs for the devices disposed on the upper face of base 336, and the description thereof will be omitted here.

Also in case exchange unit 320 configured as described above, the occurrence of a time loss during component replenishment can be prevented. Specifically, for example, when the number of A components accommodated in A component accommodating case 106, mounted in mounting section 180 of second supply device 27, decreases to a redetermined number or smaller, such A component accommodating case 106 is transferred from mounting section 180 to case holding section 253 in case exchange device 330, while A component accommodating case 106 that accommodates a sufficient amount of A components is mounted from another case holding section 253 to mounting section 180. As a result, A components are mounted on circuit boards in second supply device 27.

On the other hand, in case exchanging device 330, slider 231 is moved from a case exchanging position to a replenishing position, whereby A component accommodating case 106 is replenished with A components. Additionally, when the mounting of A components on circuit boards is completed in second supply device 27 and when slider 231 has returned to the case exchanging position in case exchanging device 330, A component accommodating case 106 mounted in mounting section 180 is transferred to case holding section 253 of case exchanging device 330, but when slider 231 has not returned to the case exchanging position, A component accommodating case 106 mounted in mounting section 180 is transferred to A component case holding section 253 of transfer device 334. This obviates the necessity for interrupting the mounting until slider 231 returns to the case exchanging position while the replenishment is being executed in case exchanging device 330, whereby the occurrence of a time loss during component replenishment can be prevented.

It should be noted that case exchanging device 332 operates like third exchanging device 214 of the first embodiment. Thus, B component accommodating case 106 is transferred and replenished with B components in case exchanging device 332, but when slider 231 of case exchanging device 332 is not located in the case exchanging position during component replenishment, B component accommodating case 106 mounted in mounting section 180 is transferred to B component case holding section 253 of transfer device 334.

That is, case exchange unit 320 of the third embodiment has the same configuration as that in which in case exchanging device 210 of the first embodiment, transfer device 334 dedicated for transferring component case 106 is disposed in place of second exchanging device 212 in case exchange unit 28 of the first embodiment. In this way, the same working effect as that of the first embodiment can be exhibited by using the device dedicated for transferring component case 106.

In the embodiments that have been described above, mounting machine 16 constitutes an example of a component mounting machine. Moving device 23 constitutes an example of a moving device. Mounting head 25 constitutes an example of a mounting head. Second supply device 27 constitutes an example of a supply device. Suction nozzle 80 constitutes an example of a holding tool. Component case 106 constitutes an example of a storage body. Storage section 156 constitutes an example of a storage section. Mounting section 180 constitutes an example of a storage body mounting section. First exchanging device 210 constitutes an example of a first replenishing device. Second exchanging device 212 constitutes an example of a second replenishing device. Third exchange device 214 constitutes an example of the first replenishing device. Sliders 231 of first exchanging device 210 and third exchanging device 214 constitute an example of a first slider. Slider 231 of second exchange device 212 constitutes an example of a second slider. Case holding sections 253 of first exchanging device 210 and third exchanging device 214 constitute an example of a first loading stand. Case holding portion 253 of second exchanging device 212 constitutes an example of a second loading stand. A system including second supply device 27, first exchange device 210, second exchange device 212 and third exchange device 214 constitutes an example of a component supply system. Case exchanging device 312 constitutes an example of a first replenishing device. Case exchanging device 314 constitutes an example of s second replenishing device. Case exchanging device 330 constitutes an example of the first replenishing device. Case exchanging device 332 constitutes an example of the first replenishing device. Transfer device 334 constitutes an example of a resting-only device. Case holding section 253 of transfer device 334 constitutes an example of a second loading stand.

It should be noted that the present disclosure is not limited to the embodiments that have been described heretofore and hence can be carried out in various modes based on various modifications and improvements made based on the knowledge of those skilled in the art. Specifically, for example, in the embodiments described above, when slider 231 has not returned to the case exchanging position due to execution of the replenishment, component case 106 is transferred to case holding section 253 of second exchanging device 212; however, when slider 231 has not returned to the case exchanging position due to a cause other than execution of replenishment, component case 106 may be transferred to case holding section 253 of second exchanging device 212. In addition, component case 106 may be transferred to case holding section 253 of second exchanging device 212 not only when slider 231 has not returned to the case exchanging position but also at other timings. For example, component case 106 may be transferred to first exchanging device 210 and third exchanging device 214 only at the time of replenishing component case 106 with components, while component case 106 may be transferred to second exchanging device 212 at other times.

In the embodiments described above, although two case holding sections 253 are provided in first exchanging device 210 or the like, three or more case holding sections 253 may be provided therein.

In the embodiments described above, although mounting machine 16 described supplies components by using second supply device 27, that is, the bulk feeder, the present disclosure may be applied to a mounting machine configured to supply components by using other methods including a tape feeder or the like.

Further, in the embodiments described above, although the present disclosure is applied to mounting machine 16 configured to mount electronic components on a circuit board, the present disclosure can be applied not only to mounting machine 16 but also to various types of work machines.

REFERENCE SIGNS LIST

16: Mounting machine (Component mounting machine) 23: Moving device; 25: Mounting head; 27: Second supply device (Supply device) (Component supply system); 80: Suction nozzle (Holding tool); 106: Component case (Storage body); 156: Storage section; 180: Mounting section (Storage body mounting section); 210: First exchanging device (First replenishing device) (Component supply system); 212: Second exchanging device (Second supply device) (Component supply system); 214: Third exchanging device (First replenishing device) (Component supply system); 231: Slider (First slider) (Second slider); 253: Case holding section (first loading stand) (Second loading stand) (Second loading stand); 312: Case exchanging device (first replenishing device); 314: Case exchanging device (second replenishing device); 330: Case exchanging device (First replenishing device); 332: Case exchanging device (First replenishing device); 334: Transfer device (Resting-only device).

The invention claimed is:

1. A component supply system comprising:
a supply device configured to move together with a mounting head, the supply device including a storage section configured to store a component and a storage body mounting section where a storage body including at least the storage section is detachably mounted and configured to supply a component from the storage section of the storage body mounted on the storage body mounting section in a supply position;
a first loading stand on which the storage body can be placed; and
a second loading stand disposed at a different location from a location where the first loading stand is disposed and on which the storage body can be placed, wherein the storage body is transferred between either of the first loading stand and the second loading stand and the storage body mounting section.

2. The component supply system according to claim 1, comprising:
a first replenishing device comprising (A) the first loading stand and (B) a first slider on which the first loading stand is disposed and configured to slide between a first position and a second position, the first replenishing device being configured to transfer the storage body between the storage body mounting section and the first loading stand in the first position and to replenish the storage section of the storage body placed on the first loading stand with components in the second position, wherein the second loading stand is disposed at a location different from a location where the first slider is disposed.

3. The component supply system according to claim 2, wherein the first replenishing device constitutes a device configured to supply a component of a first type for replenishment, the component supply system further comprising a second replenishing device comprising (C) the second loading stand and (D) a second slider on which the second loading stand is disposed and configured to slide between a third position and a fourth position, the second replenishing device being configured to transfer the storage body between the storage body mounting section and the second loading stand in the third position and to replenish the storage section of the storage body placed on the second loading stand with a component of a second type in the fourth position, and wherein the storage body storing the component of the first type therein is transferred between the storage body mounting section and the second loading stand.

4. The component supply system according to claim 2, comprising:

a second replenishing device comprising (C) the second loading stand and (D) a second slider on which the second loading stand is disposed and configured to slide between a third position and a fourth position, the second replenishing device being configured to transfer the storage body between the storage body mounting section and the second loading stand in the third position and to replenish the storage section of the storage body placed on the second loading stand with a component of a second type in the fourth position, wherein the storage body is transferred between the storage body mounting section and the second loading stand in the third position without the second slider being moved from the third position to the fourth position.

5. The component supply system according to claim 1, further comprising:

a pair of case lifting and lowering device devices that respectively lift and lower the first loading stand and the second loading stand to and from the storage body mounting section.

6. A component mounting machine, comprising:

a mounting head including a holding tool configured to hold a component supplied in a supply position and configured to mount a component held by the holding tool on a board;

a supply device configured to move together with a mounting head, the supply device including a storage section configured to store a component and a storage body mounting section where a storage body including at least the storage section is detachably mounted and configured to supply a component from the storage section of the storage body mounted on the storage body mounting section in a supply position;

a first loading stand on which the storage body can be placed;

a second loading stand disposed at a different location from a location where the first loading stand is disposed and on which the storage body can be placed, wherein the storage body is transferred between either of the first loading stand and the second loading stand and the storage body mounting section; and a moving device configured to move both the supply device and the mounting head to any position.

* * * * *